US012796426B2

(12) United States Patent
Lin et al.

(10) Patent No.: US 12,796,426 B2
(45) Date of Patent: Nov. 10, 2026

(54) INTERCONNECT STRUCTURE AND METHOD FOR FORMING THE SAME

(71) Applicant: TAIWAN SEMICONDUCTOR MANUFACTURING COMPANY, LTD., Hsinchu (TW)

(72) Inventors: Chih-Han Lin, Hsinchu City (TW); Che-Cheng Chang, New Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 363 days.

(21) Appl. No.: 18/395,197

(22) Filed: Dec. 22, 2023

(65) Prior Publication Data

US 2024/0145304 A1 May 2, 2024

Related U.S. Application Data

(63) Continuation of application No. 17/231,302, filed on Apr. 15, 2021, now Pat. No. 11,854,883.

(51) Int. Cl.
*H10W 20/00* (2026.01)
*H10D 30/62* (2025.01)
(Continued)

(52) U.S. Cl.
CPC ...... *H10W 20/069* (2026.01); *H10D 30/6211* (2025.01); *H10D 30/6219* (2025.01); *H10D 30/6729* (2025.01); *H10D 30/6735* (2025.01); *H10D 30/6757* (2025.01); *H10D 62/118* (2025.01); *H10W 20/0698* (2026.01);
(Continued)

(58) Field of Classification Search
CPC ........... H10D 30/6211; H10D 30/6219; H10D 30/6729; H10D 30/6735; H10D 30/6757; H10D 62/118; H10D 30/014; H10D 30/43; H10D 30/797; H10D 62/121; H10D 62/82; H10D 62/822; H10D 64/017; H10D 84/0158; H10D 84/038; H10W 20/0698; H10W 20/074; H10W 20/083; H10W 20/20; H10W 20/42; H10W 20/0693; H10W 20/056; H10W 20/077; H10W 20/069; B82Y 10/00
See application file for complete search history.

(56) References Cited

U.S. PATENT DOCUMENTS 11,424,188 B2 * 8/2022 Tsai ..................... H10D 64/254
2014/0077305 A1 * 3/2014 Pethe ................. H10D 30/0225 257/E21.409

(Continued)

*Primary Examiner* — Victor A Mandala
(74) *Attorney, Agent, or Firm* — Birch, Stewart, Kolasch & Birch, LLP

(57) ABSTRACT

An interconnect structure is provided. The interconnect structure includes a transistor on a substrate, a first dielectric layer over the transistor, a first metal line through the first dielectric layer, a second dielectric layer over the first dielectric layer, and a via through the second dielectric layer and on the first metal line. A first side surface of the first dielectric layer includes a first portion in direct contact with the first metal line and a second portion in direct contact with the via, and the first portion of the first side surface of the first dielectric layer is aligned with the second portion of the first side surface of the first dielectric layer.

20 Claims, 18 Drawing Sheets

(51) Int. Cl.

| | |
|---|---|
| ***H10D 30/67*** | (2025.01) |
| ***H10D 62/10*** | (2025.01) |
| ***H10W 20/20*** | (2026.01) |
| ***H10W 20/42*** | (2026.01) |

(52) U.S. Cl.
CPC ....... *H10W 20/074* (2026.01); *H10W 20/083* (2026.01); *H10W 20/20* (2026.01); *H10W 20/42* (2026.01)

(56) References Cited

U.S. PATENT DOCUMENTS

| | | | | |
|---|---|---|---|---|
| 2015/0364371 | A1 | 12/2015 | Yen et al. | |
| 2020/0098620 | A1* | 3/2020 | Lee | H10W 20/033 |
| 2020/0373165 | A1 | 11/2020 | Park et al. | |
| 2021/0082802 | A1* | 3/2021 | Huang | H10D 30/024 |
| 2022/0028743 | A1* | 1/2022 | Chuang | H10D 30/024 |
| 2022/0077292 | A1 | 3/2022 | Bae et al. | |
| 2022/0139834 | A1* | 5/2022 | Lee | H10P 14/61<br>257/774 |

* cited by examiner

INTERCONNECT STRUCTURE AND METHOD FOR FORMING THE SAME

PRIORITY CLAIM AND CROSS-REFERENCE

This application is a Continuation Application of U.S. application Ser. No. 17/231,302, filed on Apr. 15, 2021, entitled "INTERCONNECT STRUCTURE AND METHOD FOR FORMING THE SAME," which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1, 1B-1, 1E-1, 1G-1 and 1H-1 are plan views illustrating the formation of a semiconductor structure at various intermediate stages, in accordance with some embodiments of the disclosure.

FIGS. 2A-1 and 2C-1 are plan views illustrating the formation of a semiconductor structure at various intermediate stages, in accordance with some embodiments of the disclosure.

FIGS. 3A-1 and 3C-1 are plan views illustrating the formation of a semiconductor structure at various intermediate stages, in accordance with some embodiments of the disclosure.

FIGS. 4A-1 and 4C-1 are plan views illustrating the formation of a semiconductor structure at various intermediate stages, in accordance with some embodiments of the disclosure.

DETAILED DESCRIPTION

Figures 1, 1A:
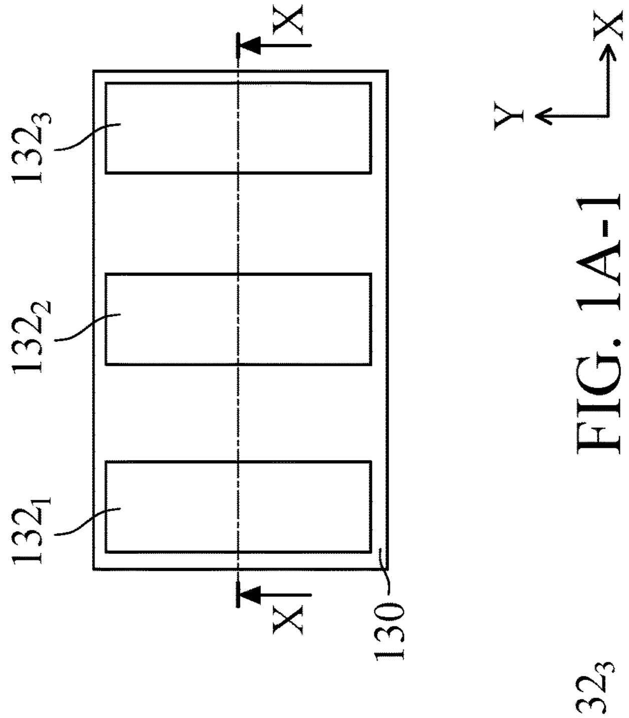
Figure 1A:
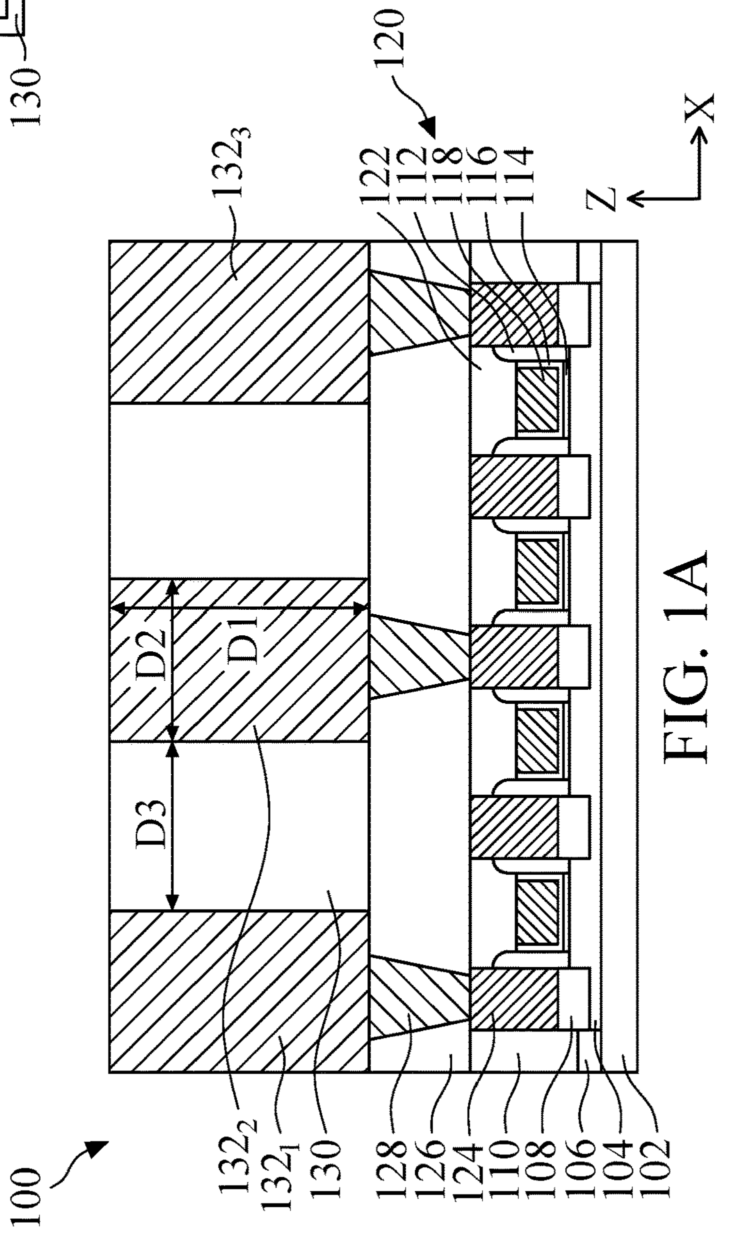
FIGS. 1A-1H are cross-sectional views illustrating the formation of a semiconductor structure at various intermediate stages, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of a method for forming an interconnect structure of a semiconductor device are provided. The method may include etching the metal lines in such a way that the intermetal dielectric layer protrudes from between the metal lines. As a result, a portion of the via exceeding the edge of the corresponding metal line may be raised, which may avoid the minimum distance between the via and the neighboring metal line from getting shorter. Therefore, the via-to-line overlay and/or the via CD window of the photolithography process may be improved.

FIGS. 1A-1H are cross-sectional views illustrating the formation of a semiconductor structure at various intermediate stages, in accordance with some embodiments. FIGS. 1A-1, 1B-1, 1E-1, 1G-1 and 1H-1 are plan views illustrating the formation of a semiconductor structure at various intermediate stages, in which FIGS. 1A, 1B, 1E, 1G and 1H correspond to cross-sections X-X shown in FIGS. 1A-1, 1B-1, 1E-1, 1G-1 and 1H-1, respectively, in accordance with some embodiments.

For a better understanding of the semiconductor structure, an X-Y-Z coordinate reference is provided in the figures of the present disclosure. The X-axis and Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

FIG. 1A illustrate a semiconductor structure 100 which may be a portion of a FinFET device, in accordance with some embodiments. The formation of the semiconductor structure 100 includes received or provided a substrate 102, and forming a fin structure 104 and an isolation structure 106 over the substrate 102, in accordance with some embodiments. The isolation structure 106 surrounds a lower portion the fin structure 104, in accordance with some embodiments. In some embodiments, the isolation structure 106 cuts through the fin structure 104 into several segments. In some embodiments, the fin structure 104 extends in the X direction. That is, the fin structure 104 has a longitudinal axis parallel to the X direction, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GalnAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

Though the semiconductor structure 100 is depicted with one fin structure 104, the embodiments of the present disclosure contemplate the semiconductor structure 100 having more than one fin structure 104. In some embodiments, the formation of the fin structure 104 includes etching the substrate 102 to form trenches so that the fin structure 104 protrudes from between the trenches. Afterward, the trenches are filled with an insulating material for the isolation structure 106, in accordance with some embodiments. The insulating material is also formed over the upper surfaces of the fin structures 104, in accordance with some embodiments. In some embodiments, the insulating material includes silicon oxide, silicon nitride, silicon oxynitride (SiON), another suitable insulating material, and/or a combination thereof. In some embodiments, the insulating material is deposited using chemical vapor deposition (CVD) such as low pressure CVD (LPCVD), plasma enhanced CVD (PECVD), or high density plasma CVD (HDP-CVD), high aspect ratio process (HARP), flowable CVD (FCVD)); atomic layer deposition (ALD); another suitable method, and/or a combination thereof.

The insulating material over the upper surfaces of the fin structures 104 is removed to expose the upper surface of the fin structure 104, for example, using chemical mechanical polishing (CMP), in accordance with some embodiments. Afterward, the insulating material is further recessed to expose an upper portion of the sidewalls of the fin structures 104 and forms the isolation structure 106 that surrounds the lower portion of the fin structure 104, in accordance with some embodiments.

The formation of the semiconductor structure 100 further includes forming gate stacks 120 over a channel region of the fin structure 104, as shown in FIG. 1A, in accordance with some embodiments. In some embodiments, the gate stacks 120 extend in the Y direction. That is, the gate stacks 120 have longitudinal axes parallel to the Y direction, in accordance with some embodiments. In some embodiments, the gate stacks 120 extend across the fin structures 104, so that the gate stacks 120 each wrap a portion of the fin structure 104, in accordance with some embodiments. The gate stacks 120 interpose between a source region and a drain region of the fin structure 104, where the channel region is defined between the source region and the drain region, in accordance with some embodiments. The gate stacks 120 engage the channel region, so that current can flow between the source/drain regions during operation.

In some embodiments, each gate stack 120 includes an interfacial layer 114, a gate dielectric layer 116 formed on the interfacial layer 114, and a gate electrode layer 118 formed on the gate dielectric layer 116. In some embodiments, the interfacial layer 114 is made of silicon oxide ($SiO_2$). In some embodiments, the interfacial layer 114 is formed by chemical oxidation, thermal oxidation, ALD, CVD, another suitable method, and/or a combination thereof. In some embodiments, the gate dielectric layer 116 is made of a dielectric material with high dielectric constant (k value), for example, greater than 3.9. In some embodiments, the high-k dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, another suitable material, and/or a combination thereof. The high-k gate dielectric layer may be formed by ALD, physical vapor deposition (PVD), CVD, thermal oxidation, and/or another suitable method.

In some embodiments, the gate electrode layer 118 includes a conductive material, such as doped semiconductor, metal, metal alloy, or metal silicide. In some embodiments, the gate electrode layer 118 includes a single layer or alternatively a multilayer structure, such as various combinations of a metal layer with a selected work function to enhance the device performance (work function metal layer), a liner layer, a wetting layer, an adhesion layer, a metal fill layer, and/or another suitable layer. The gate electrode layer 118 may be made of doped polysilicon, doped poly-germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof. The gate electrode layer 118 may be formed by ALD, PVD, CVD, e-beam evaporation, or another suitable process. Furthermore, the gate stacks 120 may be formed separately for n-channel FinFETs and p-channel FinFETs, which may use different gate electrode materials and/or different work function materials.

The formation of the semiconductor structure 100 further includes forming gate spacer layers 112 over the substrate 102, as shown in FIG. 1A, in accordance with some embodiments. The gate spacer layers 112 extend along opposite sides of the gate stacks 120, in accordance with some embodiments. In some embodiments, the gate spacer layer 106 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layers 112 includes conformally depositing a dielectric material for the gate spacer layers 112 over the substrate 102 followed by an anisotropic etching process such as dry etching.

The formation of the semiconductor structure 100 further includes forming source/drain features 108 in the source region and the drain region of the fin structure 104, as shown in FIG. 1A, in accordance with some embodiments. The source/drain features 108 are formed on the fin structures 104 and on the opposite sides of the gate stacks 120, in accordance with some embodiments. The source/drain features 108 and the gate stack 120 between the source/drain features 108 combine to form an active device, for example, used for logic devices, memory devices, periphery circuitry devices, other suitable devices, and/or a combination thereof.

The formation of the source/drain features 108 includes recessing the source/drain region of the fin structures 104 to form source/drain recesses on opposite sides of the gate stacks 120, in accordance with some embodiments. Afterward, the source/drain features 108 are grown in the source/drain recesses using an epitaxial growth process, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the source/drain features 108 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 108 are in-situ doped during the epitaxial growth process. For example, the source/drain features 108 may be the epitaxially grown SiGe doped with boron (B). For example, the source/drain features 108 may be the epitaxially grown Si doped with carbon to form silicon:carbon (Si:C) source/drain features, phosphorous to form silicon: phosphor (Si:P) source/drain features, or both carbon and phosphorous to form silicon carbon phosphor (SiCP) source/drain features.

The formation of the semiconductor structure 100 further includes forming a lower (or first) interlayer dielectric (ILD) layer 110 over the substrate 102, as shown in FIG. 1A, in accordance with some embodiments. The lower interlayer dielectric layer 110 covers the isolation structure 106, the fin structure 104, the gate stacks 120, the gate spacer layers 112, and the source/drain features 108, in accordance with some embodiments.

In some embodiments, the lower interlayer dielectric layer 110 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), another suitable dielectric material, and/or a combination thereof. In some embodiments, the lower interlayer dielectric layer 110 is formed using CVD (such as HDP-CVD, PECVD, HARP or FCVD), ALD, another suitable method, and/or a combination thereof. In some embodiments, the lower interlayer dielectric layer 110 is a multilayer structure. For example, the lower interlayer dielectric layer 110 may include a bottom lining layer that serves as an etching stop layer and a bulk layer having low-k dielectric constant over the bottom lining layer. The term "etching stop layer" used herein refers to a layer that may provide a mechanism to stop or slow down an etching process when forming, e.g., openings, holes, trenches, etc. The bottom lining layer may be made of a dielectric material having a different etching selectivity from the bulk layer.

In some embodiments, the semiconductor structure 100 is formed using a gate-late process. For example, dummy gate structures (not shown) including dummy gate dielectric layers and dummy gate electrode layers may be formed across the fin structures 104 in the place where the gate stacks 120 are to be formed, before the gate spacer layers 112 and the source/drain feature 108 are formed. After the lower interlayer dielectric layer 110 is formed, the dummy gate structures may be replaced with the gate stacks 120. The replacement process may include removing the dummy gate structures using one or more etching processes to form gate trenches, and forming the gate stacks 120 in the gate trenches.

The formation of the semiconductor structure 100 further includes recessing the gate spacer layers 112 and the gate stacks 120 by one or more etching processes, and forming mask layers 122 over the gate spacer layers 112 and the gate stacks 120, as shown in FIG. 1A, in accordance with some embodiments. In some embodiments, the upper surfaces of the recessed gate spacer layers 112 are located at a higher level than the upper surfaces of the recessed gate stacks 120. In some embodiments, the mask layers 122 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The mask layers 122 may be configured to protect the gate spacer layers 112 and the gate stacks 120 during the subsequent formation of contact plugs. In some embodiments, the mask layers 122 are made of a different material than the lower interlayer dielectric layer 110 and have a different etching selectivity than the lower interlayer dielectric layer 110.

The formation of the semiconductor structure 100 further includes forming a multilayer interconnect structure over the substrate 102, in accordance with some embodiments. The multilayer interconnect structure electrically couples various devices (for example, transistors, resistors, capacitors, and/or inductors) and/or components of devices (such as the source/drain features 108 and/or the gate stacks 120), in accordance with some embodiments.

In some embodiments, the multilayer interconnect structure typically includes a combination of dielectric layers and electrically conductive features formed in the dielectric layers. The conductive features are configured to form vertical interconnect features (providing, for example, vertical connection between features and/or vertical electrical routing), such as contact plugs and/or vias, and/or horizontal interconnect features (providing, for example, horizontal electrical routing), such as metal lines, in accordance with some embodiments. Vertical conductive features of a multilayer interconnect structure typically connect horizontal conductive features in different layers (or different planes) of the multilayer interconnect structure, in accordance with some embodiments. The formation of a multilayer interconnect structure is described in detail below.

Contact plugs 124 are formed in and/or through the lower interlayer dielectric layer 110, as shown in FIG. 1A, in accordance with some embodiments. In some embodiments, the contact plugs 124 and the lower interlayer dielectric layer 110 combine to form one interconnect layer of the multilayer interconnect structure. The contact plugs 124 land on and are electrically connected to the source/drain features 108, in accordance with some embodiments.

In some embodiments, the formation of the contact plugs 124 includes patterning the lower interlayer dielectric layer 110 to form contact openings (where the contact plugs 124 are to be formed) through the lower interlayer dielectric layer 110 and exposing the source/drain features 108 using photolithography and etching processes, forming a silicide layer (such as WSi, NiSi, TiSi and/or CoSi) on the exposed source/drain features 108, depositing one or more conductive materials for the contact plugs 124 to fill the contact openings, and planarizing the one or more conductive materials over the upper surface of the lower interlayer dielectric layer 110 using, for example, CMP. In some embodiments, the conductive material is deposited using CVD, PVD, e-beam evaporation, ALD, electroplating (ECP), electroless deposition (ELD), another suitable method, or a combination thereof. After the planarization process, the upper surfaces of the contact plugs 124, the upper surface of the lower interlayer dielectric layer 110 and the upper surfaces of the mask layers 122 are substantially coplanar, in accordance with some embodiments.

The contact plugs 124 may have a multilayer structure including, for example, liner layers, glue layers, barrier layers, seed layers, metal bulk layers, another suitable layer, and/or a combination thereof. For example, a barrier layer (not shown) may optionally be formed along the sidewall and the bottom surface of the contact openings. The barrier layer is used to prevent the metal from the subsequently formed metal material from diffusing into the dielectric material (e.g., the lower interlayer dielectric layer 110). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewall and the bottom surface of the contact openings, and on the barrier layer (if formed). The glue layer is used to improve adhesion between the subsequently formed metal material and the dielectric material (e.g., the lower interlayer dielectric layer 110). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layers are made of one or more conductive materials with low resistance and good gap-fill ability, for example, cobalt (Co), nickel (Ni), tungsten (W), titanium (Ti), tantalum (Ta), copper (Cu), aluminum (Al), ruthenium (Ru), molybdenum (Mo), another suitable metal material, and/or a combination thereof.

An upper (second) interlayer dielectric layer 126 is formed over the lower interlayer dielectric layer 110 and the contact plugs 124, as shown in FIG. 1A, in accordance with some embodiments. In some embodiments, the upper interlayer dielectric layer 126 is made of a dielectric material, such as USG, or doped silicon oxide such as BPSG, FSG, PSG, BSG, another suitable dielectric material, and/or a combination thereof. In some embodiments, the upper interlayer dielectric layer 126 is formed using CVD (such as HDP-CVD, PECVD, HARP, or FCVD), ALD, another suitable method, and/or a combination thereof. In some embodiments, the upper interlayer dielectric layer 126 is a multilayer structure. For example, the upper interlayer dielectric layer 126 may include a bottom lining layer serving as an etching stop layer and a bulk layer having low-k dielectric constant over the bottom lining layer. The bottom lining layer may be made of a dielectric material having a different etching selectivity from the bulk layer.

Vias 128 are formed in and/or through the upper interlayer dielectric layer 126, as shown in FIG. 1A, in accordance with some embodiments. In some embodiments, the vias 128 and the upper interlayer dielectric layer 126 combine to form one interconnect layer of the multilayer interconnect structure that is formed over and electrically coupled to the previous interconnect layer (including the contact plugs 124 and the lower interlayer dielectric layer 110). The vias 128 land on the contact plugs 124 and are electrically connected to the source/drain features 108, and therefore the vias 128 are also referred to as source/drain vias, in accordance with some embodiments. In some embodiments, gate vias (not shown) are formed through the upper interlayer dielectric layer 126 and the lower interlayer dielectric layer 110 and land on and are electrically connected to the gate electrode layers 118.

In some embodiments, the formation of the vias 128 includes patterning the upper interlayer dielectric layer 126 to form via openings (where the vias 128 are to be formed) through the upper interlayer dielectric layer 126 and exposing the contact plugs 124 using photolithography and etching processes, depositing one or more conductive materials for the vias 128 to fill the via openings, and planarizing the one or more conductive materials over the upper surface of the upper interlayer dielectric layer 126 using, for example, CMP. In some embodiments, the conductive material is deposited using CVD, PVD, e-beam evaporation, ALD, ECP, ELD, another suitable method, or a combination thereof. After the planarization process, the upper surfaces of the vias 128 and the upper interlayer dielectric layer 126 are substantially coplanar, in accordance with some embodiments.

The vias 124 may have a multilayer structure including, for example, liner layers, glue layers, barrier layers, seed layers, metal bulk layers, another suitable layer, and/or a combination thereof. For example, a barrier layer (not shown) may optionally be formed along the sidewall and the bottom surface of the via openings. The barrier layer is used to prevent the metal from the subsequently formed metal material from diffusing into the dielectric material (e.g., the upper interlayer dielectric layer 126). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewall and the bottom surface of the via openings, and on the barrier layer (if formed). The glue layer is used to improve adhesion between the subsequently formed metal material and the dielectric material (e.g., the upper interlayer dielectric layer 126). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the via openings. In some embodiments, the metal bulk layer is formed using a selective deposition technique such as cyclic CVD process or ELD process, and it is not necessary to form a glue layer in the via openings before depositing the metal bulk material. In some embodiments, the metal bulk layers are made of one or more conductive materials with low resistance and good gap-fill ability, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), another suitable metal material, and/or a combination thereof.

An (a first) intermetal dielectric (IMD) layer 130 is formed over the vias 128 and the upper interlayer dielectric layer 126, as shown in FIGS. 1A and 1A-1, in accordance with some embodiments. In some embodiments, the intermetal dielectric layer 130 is made of one or more dielectric materials, such as silicon oxide (SiO), silicon nitride (SiN), silicon oxynitride (SiON), silicon carbide (SiC), aluminum oxide ($Al_2O_3$), dielectric material(s) with low dielectric constant (low-k) such as SiCOH, SiOCN, and/or SiOC, and/or a combination thereof.

In some embodiments, the intermetal dielectric layer 130 is made of an extreme low-k (ELK) dielectric material with a dielectric constant (k) less than about 3.0, or even less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the intermetal dielectric layer 130 is formed using CVD (such as LPCVD, HARP, and FCVD), ALD, spin-on coating, another suitable method, or a combination thereof. A post-curing process (e.g., UV curing) may be performed on the as-deposited ELK dielectric material for the intermetal dielectric layer 130 to form a porous structure.

In some embodiments, the intermetal dielectric layer 130 is made of a single, continuous material, as shown in FIG. 1A. In some embodiments, the intermetal dielectric layer 130 may be a multilayer structure. For example, the intermetal dielectric layer 130 may include a bottom lining layer to serve as an etching stop layer and a bulk layer having low-k dielectric constant over the bottom lining layer. The bottom lining layer may be made of a dielectric material having a different etching selectivity from the bulk layer.

Metal lines $\mathbf{132}_1$, $\mathbf{132}_2$ and $\mathbf{132}_3$ are formed in and/or through the intermetal dielectric layer 130, as shown in FIGS. 1A and 1A-1, in accordance with some embodiments. In some embodiments, the metal lines $\mathbf{132}_1$, $\mathbf{132}_2$ and $\mathbf{132}_3$ and the intermetal dielectric layer 130 combine to form one interconnect layer of the multilayer interconnect structure that is formed over and electrically coupled to the previous interconnect layer (including the vias 128 and the upper interlayer dielectric layer 126). The metal lines $\mathbf{132}_1$, $\mathbf{132}_2$ and $\mathbf{132}_3$ correspond to and are electrically connected to the vias 128, in accordance with some embodiments. In some embodiments, the metal lines $\mathbf{132}_1$, $\mathbf{132}_2$ and $\mathbf{132}_3$ extend in the Y direction. Though the semiconductor structure 100 is depicted with three metal lines 132, the embodiments of the present disclosure contemplate the semiconductor structure 100 having more than three metal lines 132.

In some embodiments, the formation of the metal lines $\mathbf{132}_1$, $\mathbf{132}_2$ and $\mathbf{132}_3$ includes patterning the intermetal dielectric layer 130 to form trenches (where the metal lines $\mathbf{132}_1$, $\mathbf{132}_2$ and $\mathbf{132}_3$ are to be formed) through the intermetal dielectric layer 130 and exposing the vias 128. The patterning process may include forming a patterned mask layer (such as a photoresist layer and/or a hard mask layer, not shown) on the intermetal dielectric layer 130, and etching the intermetal dielectric layer 130 uncovered by the patterned mask layer. For example, a photoresist may be formed on the intermetal dielectric layer 130, such as by using spin-on coating, and patterned with patterns corresponding to the trenches by exposing the photoresist to light using an appropriate photomask. Exposed or unexposed portions of the photoresist may be removed depending on whether a positive or negative resist is used.

The patterns of the photoresist may then be transferred to the intermetal dielectric layer 130, such as by using one or more suitable etch processes. The photoresist can be removed in an ashing or wet strip process, for example. Alternatively, a hard mask layer may be formed on the intermetal dielectric layer 130. The hard mask layer may include, or be formed of, a nitrogen-free anti-reflection layer (NFARL), carbon-doped silicon dioxide (e.g., $SiO_2$:C), titanium nitride (TiN), titanium oxide (TiO), boron nitride (BN), a multilayer thereof, another suitable material, and/or a combination thereof. The hard mask layer may be patterned using photolithography and etching processes described above to have patterns corresponding to the trenches. The patterned hard mask layer may transfer the patterns to the intermetal dielectric layer 130 to form the trenches, which may be accomplished by using one or more suitable etch processes. The etch processes may include dry etching such as a reactive ion etch (RIE), neutral beam etch (NBE), inductive coupled plasma (ICP) etch, another suitable method, or a combination thereof. The etch processes may be anisotropic.

One or more conductive materials for the metal lines $\mathbf{132}_1$, $\mathbf{132}_2$ and $\mathbf{132}_3$ are then deposited over the intermetal dielectric layer 130 to fill the trenches. In some embodiments, the conductive material is deposited using CVD, PVD, e-beam evaporation, ALD, ECP, ELD, another suitable method, or a combination thereof. Afterwards, a planarization process such as CMP and/or an etching back process is performed on the one or more conductive materials to remove an excess portion of the conductive materials from the upper surface of the intermetal dielectric layer 130. After the planarization process, the upper surfaces of the metal lines $\mathbf{132}_1$, $\mathbf{132}_2$ and $\mathbf{132}_3$ and the intermetal dielectric layer 130 are substantially coplanar, in accordance with some embodiments. The planarization process may also remove the patterned hard mask layer.

The metal lines $\mathbf{132}_1$, $\mathbf{132}_2$ and $\mathbf{132}_3$ may have a multilayer structure including, for example, liner layers, glue layers, barrier layers, seed layers, metal bulk layers, another suitable layer, and/or a combination thereof. For example, a barrier layer (not shown) may optionally be formed along the sidewalls and the bottom surfaces of the trenches. The barrier layer is used to prevent the metal from the subsequently formed metal material from diffusing into the dielectric material (e.g., the intermetal dielectric layer 130). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewalls and the bottom surfaces of the trenches, and on the barrier layer (if formed). The glue layer is used to improve adhesion between the subsequently formed metal material and the dielectric material (e.g., the intermetal dielectric layer 130). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the trenches. In some embodiments, the metal bulk layer is formed using a selective deposition technique such as cyclic CVD process or ELD process, and it is not necessary to form a glue layer in the trenches before depositing the metal bulk material. In some embodiments, the metal bulk layers are made of one or more conductive materials with low resistance and good gap-fill ability, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), another suitable metal material, and/or a combination thereof.

In some embodiments, the metal lines $132_1$, $132_2$ and $132_3$ have a thickness D1 in a range from about 3 nanometers (nm) to about 1000 nm. In some embodiments, the metal lines $132_1$, $132_2$ and $132_3$ have a width D2 in a range from about 3 nm to about 500 nm. In some embodiments, a distance D3 between the neighboring metal lines 132 is in a range from about 3 nm to about 500 nm.

Figures 1, 1B:
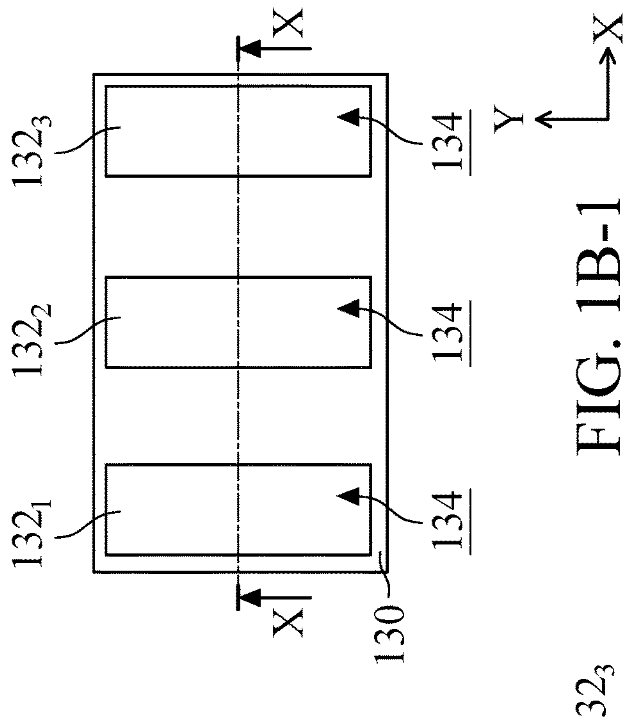
Figure 1B:
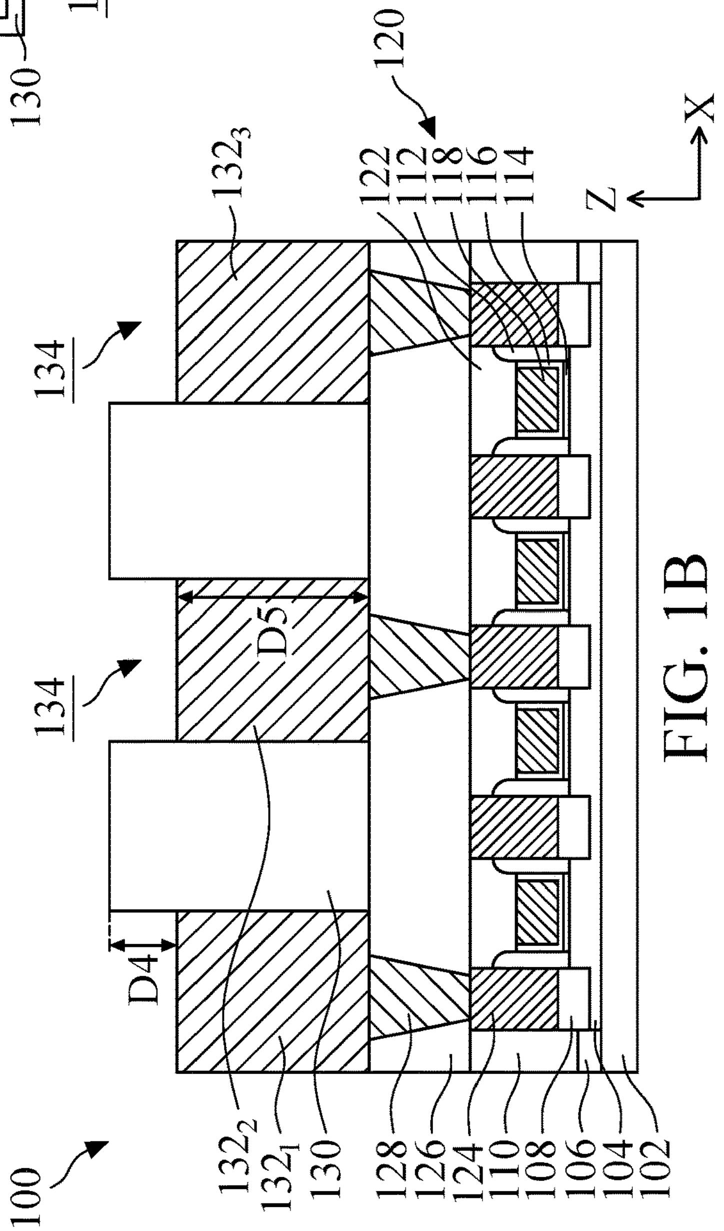

An etching process is performed on the semiconductor structure 100, thereby recessing the metal lines $132_1$, $132_2$ and $132_3$, as shown in FIG. 1B, in accordance with some embodiments. In some embodiments, the etching process is performed without the need for a photolithography step. That is, in some embodiments, no masking element is formed above the intermetal dielectric layer 130 and the metal lines $132_1$, $132_2$ and $132_3$ during the etching process. In some embodiments, the etching process is an anisotropic etching process such as dry plasma etching, an isotropic etching process such as dry chemical etching, remote plasma etching or wet chemical etching, and/or a combination thereof. Each of the metal lines $132_1$, $132_2$ and $132_3$ are etched to form recess 134 over the metal line 132 in the intermetal dielectric layer 130, as shown in FIGS. 1B and 1B-1, in accordance with some embodiments.

In some embodiments, the intermetal dielectric layer 130 remains substantially unetched or only slightly etched during the etching process. In some embodiments, the intermetal dielectric layer 130 protrudes from between the metal lines 132. The recesses 134 partially expose the side surfaces of the intermetal dielectric layer 130, in accordance with some embodiments. The upper surface of the intermetal dielectric layer 130 is located at a higher level than the upper surfaces of the metal lines 132, in accordance with some embodiments. In some embodiments, the recesses 134 has an etching depth D4 in a range from about to about 1 nm to about 500 nm. In some embodiments, the etched metal lines $132_1$, $132_2$ and $132_3$ have a thickness D5 in a range from about 3 nm to about 500 nm.

In some embodiments, a ratio of the etching depth D4 to the distance D3 (FIG. 1A) is in a range from about 0.1 to about 10. If the etching depth D4 (or the ratio of the etching depth D4 to the distance D3) is too small, the via-to-line overlay window and/or the via CD window may not be sufficiently improved, which will be described in detail later. If the etching depth D4 (or the ratio of the etching depth D4 to the distance D3) is too large, the subsequently formed via may be too thick, leading to high resistance.

In some embodiments, a ratio of the etching depth D4 to the thickness D5 is in a range from about 0.1 to about 10. If the ratio of the etching depth D4 to the thickness D5 is too small, the via-to-line overlay window and/or the via CD window may not be sufficiently improved. If the ratio of the etching depth D4 to the thickness D5 is too large, the subsequently formed via may be too thick, leading to high resistance.

Figure 1C:
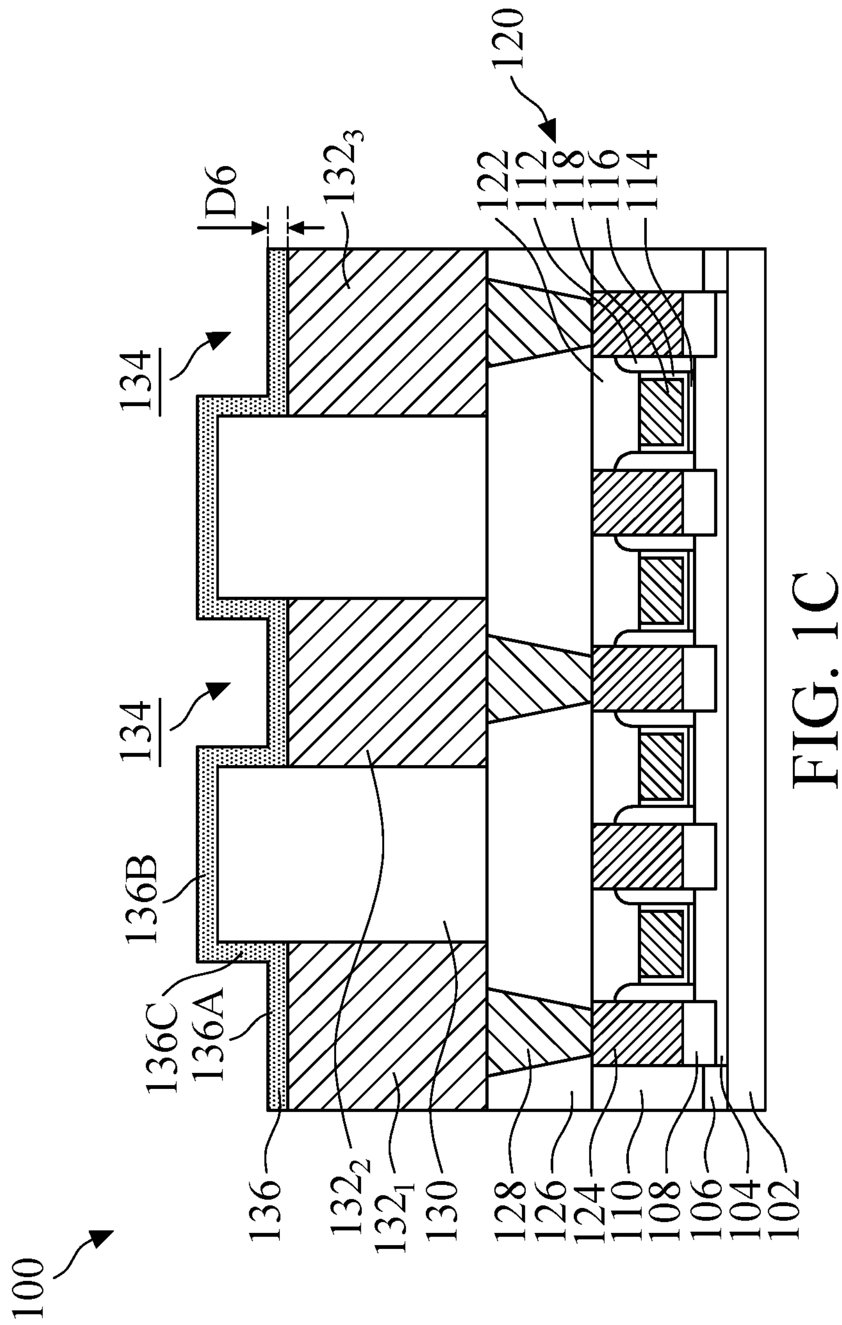

An etching stop layer 136 is formed over the intermetal dielectric layer 130 and the metal lines $132_1$, $132_2$ and $132_3$, as shown in FIG. 1C, in accordance with some embodiments. The etching stop layer 136 is conformally formed along and covers the upper surfaces of the metal lines $132_1$, $132_2$ and $132_3$ and the upper surface and the exposed side surfaces of the intermetal dielectric layer 130, in accordance with some embodiments. In some embodiments, the etching stop layer 136 partially fills the recesses 134.

The etching stop layer 136 includes a horizontal lower portion 136A along the upper surfaces of the metal lines $132_1$, $132_2$ and $132_3$, a horizontal upper portion 136B along the upper surface of the intermetal dielectric layer 130, and a vertical portion 136C along the side surfaces of the intermetal dielectric layer 130, in accordance with some embodiments. The horizontal upper portion 136B is located at a higher level than the horizontal lower portion 136A and is connected to the horizontal lower portion 136A through the vertical portion 136C, in accordance with some embodiments.

In some embodiments, the etching stop layer 136 is made of a silicon-containing dielectric material such as silicon nitride (SiN), silicon carbon nitride (SiCN), silicon oxide carbonitride (SiOCN), silicon carbide (SiC), another suitable dielectric material, and/or a combination thereof. In some embodiments, the etching stop layer 136 is made of a dielectric material with a high-k dielectric constant (such as greater than about 7), for example, aluminum oxide, zirconium oxide, hafnium oxide, yttrium oxide, hafnium oxide, another suitable metal oxide, and/or a combination thereof. The etching stop layer 136 is globally deposited using CVD, ALD, spin-on coating, another suitable method, or a combination thereof. In some embodiments, the etching stop layer 136 has a thickness D6 in a range from about 1 nm to about 50 nm. The etching stop layer 136 may be made of a dielectric material having a different etching selectivity from the intermetal dielectric layer 130. In some embodiments, the dielectric constant of the etching stop layer 136 is higher dielectric constant than the intermetal dielectric layer 130.

Figure 1D:
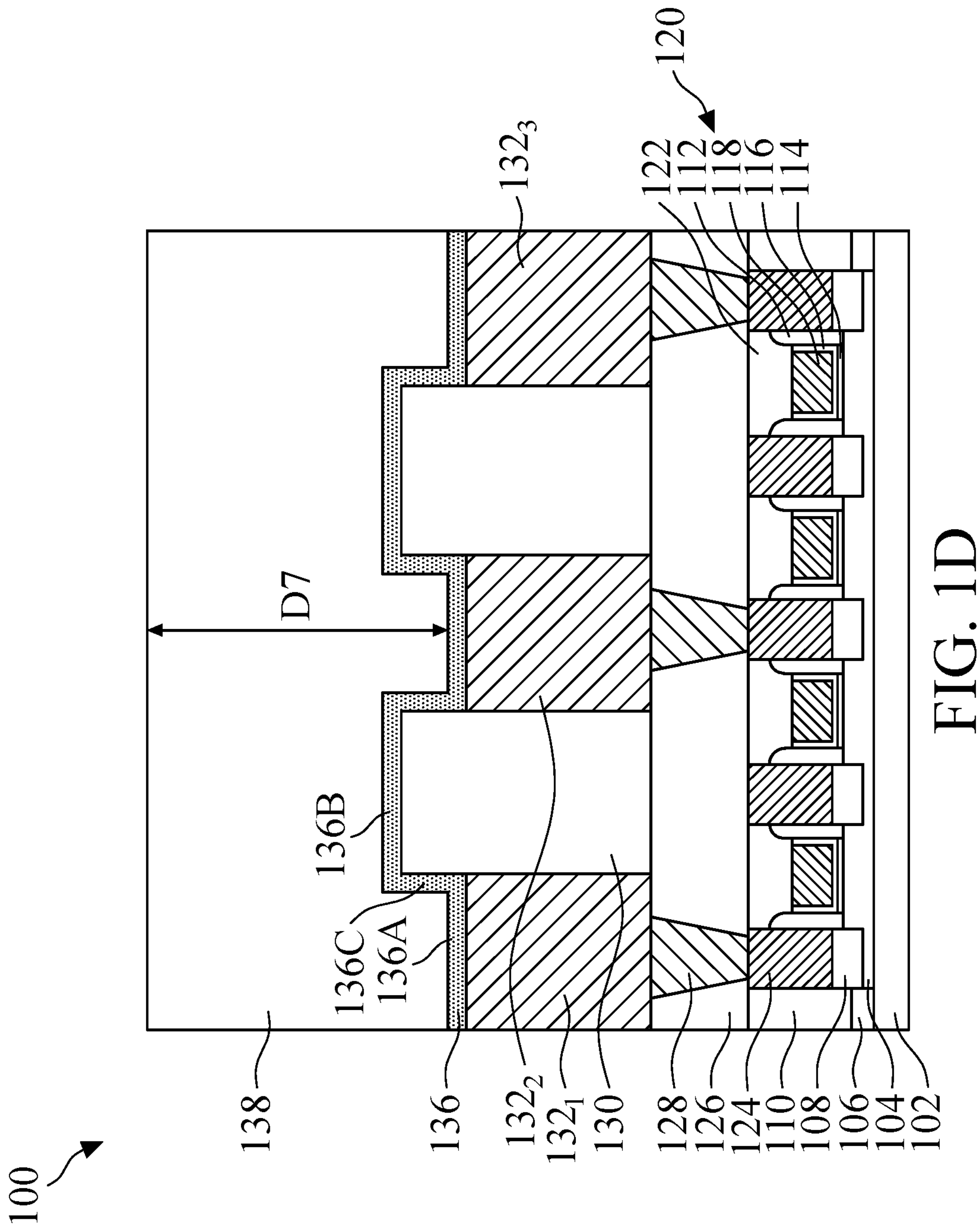

A dielectric bulk layer 138 is formed over the etching stop layer 136, as shown in FIG. 1D, in accordance with some embodiments. The dielectric bulk layer 138 fills the remainder of the recesses 134, in accordance with some embodiments. In some embodiments, the dielectric bulk layer 138 is made of a silicon-containing dielectric material such as silicon oxide (SiO), silicon nitride (SiN), silicon oxynitride (SiON), silicon carbide (SiC), dielectric material(s) with low dielectric constant (low-k) such as SiCOH, SiOCN, and/or SiOC, and/or a combination thereof.

In some embodiments, the dielectric bulk layer 138 is made of an ELK dielectric material with a dielectric constant (k) less than about 3.0, or even less than about 2.5. In some embodiments, ELK dielectric materials include carbon doped silicon oxide, amorphous fluorinated carbon, parylene, BCB, PTFE (Teflon), or silicon oxycarbide polymers (SiOC). In some embodiments, ELK dielectric materials include a porous version of an existing dielectric material, such as HSQ, MSQ, PAE, porous SiLK, or porous silicon oxide ($SiO_2$). In some embodiments, the dielectric bulk layer 138 is formed using CVD (such as LPCVD, HARP, and FCVD), ALD, spin-on coating, another suitable method, or a combination thereof. A post-curing process (e.g., UV curing) may be performed on the as-deposited ELK dielectric material for the dielectric bulk layer 138 to form a porous structure. The dielectric bulk layer 138 may be made of a dielectric material having a different etching selectivity from the etching stop layer 136. In some embodiments, dielectric constant of the etching stop layer 136 is higher dielectric constant than the dielectric bulk layer 138.

In some embodiments, the dielectric bulk layer 138 is made of a single, continuous material, as shown in FIG. 1D. In some embodiments, the dielectric bulk layer 138 and the etching stop layer 136 collectively referred to as an (a second) intermetal dielectric layer. In some embodiments, the dielectric bulk layer 138 has a thickness D7 from the bottommost surface, which is in a range from about 10 nm to about 800 nm.

Figures 1, 1E:
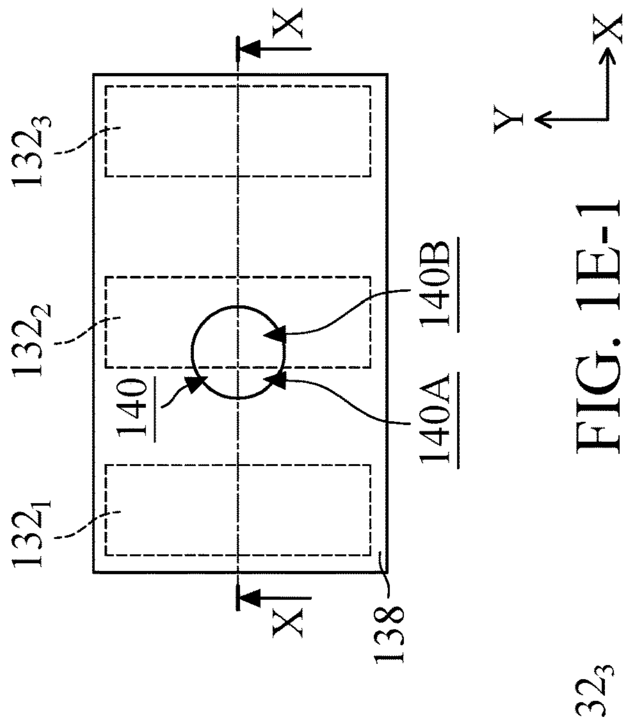
Figure 1E:
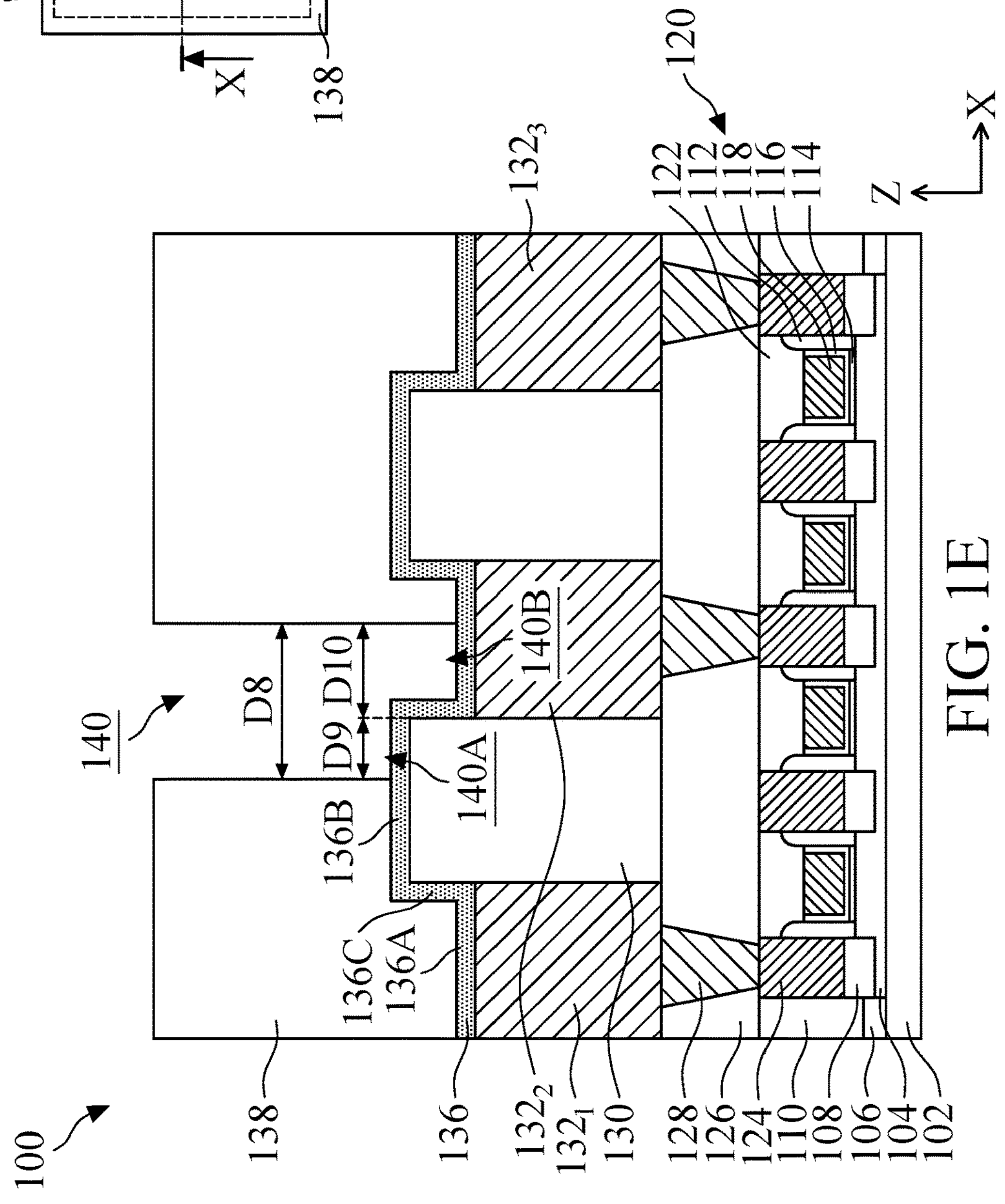

A via opening 140 is formed in and/or through the dielectric bulk layer 138, as shown in FIGS. 1E and 1E-1, in accordance with some embodiments. The via opening 140 corresponds to the metal line $132_2$, in accordance with some embodiments. The via opening 140 is offset from the metal line $132_2$, in accordance with some embodiments. When viewed from FIG. 1E-1, the via opening 140 has a first portion 140A outside of the area of the metal line $132_2$ and at the side close to the metal line 132*i* and a second portion 140B inside the area of the metal line $132_2$. The via opening 140 exposes the horizontal lower portion 136A, the horizontal upper portion 136B, and the vertical portion 136C of the etching stop layer 136, in accordance with some embodiments.

In some embodiments, the formation of the via opening 140 includes patterning the dielectric bulk layer 138. The patterning process may include forming a patterned mask layer (such as a photoresist layer and/or a hard mask layer, not shown) on the dielectric bulk layer 138, and etching the dielectric bulk layer 138 uncovered by the patterned mask layer until the etching stop layer 136 is exposed. For example, a photoresist may be formed on the dielectric bulk layer 138, such as by using spin-on coating, and patterned with a pattern corresponding to the via opening 140 by exposing the photoresist to light using an appropriate photomask. Exposed or unexposed portions of the photoresist may be removed depending on whether a positive or negative resist is used.

The pattern of the photoresist may then be transferred to the dielectric bulk layer 138, such as by using one or more suitable etch processes. The photoresist can be removed in an ashing or wet strip process, for example. Alternatively, a hard mask layer may be formed on the dielectric bulk layer 138. The hard mask layer may include, or be formed of, a nitrogen-free anti-reflection layer (NFARL), carbon-doped silicon dioxide (e.g., $SiO_2$:C), titanium nitride (TiN), titanium oxide (TiO), boron nitride (BN), a multilayer thereof, another suitable material, and/or a combination thereof. The hard mask layer may be patterned using photolithography and etching processes described above to have a pattern corresponding to the via opening 140. The patterned hard mask layer may transfer the pattern to the dielectric bulk layer 138 to form the via opening 140, which may be accomplished by using one or more suitable etch processes. The etch processes may include dry etching such as a RIE, NBE, ICP etch, another suitable method, or a combination thereof. The etch processes may be anisotropic.

In some embodiments, the via opening 140 has a width D8 in a range from about 1 nm to about 500 nm. In some embodiments, the width D8 is equal to or less than the width D2 (FIG. 1A) of the metal line 132. In alternative embodiments, the width D8 is greater than the width D2 (FIG. 1A) of the metal line $132_2$. In some embodiments, the first portion 140A of the via opening 140 outside of the area of the metal line $132_2$ (or exceeding the edge of the metal line $132_2$) has a dimension D9 that is in a range from about 1 nm to about 100 nm. In some embodiments, the second portion 140B of the via opening 140 inside the area of the metal line $132_2$ (overlapping the metal line $132_2$) has a dimension D10 that is in a range from about 1 nm to about 500 nm. In some embodiments, the dimension D9 may be less than the dimension D10. In alternative embodiments, the dimension D9 may be greater than or equal to the dimension D10.

In some embodiments, a ratio of the etching depth D4 (FIG. 1B) to the dimension D10 is in a range from about 0.1 to about 10. If the ratio of the etching depth D4 to the dimension D10 is too small, the via-to-line overlay window and/or the via CD window may not be sufficiently improved. If the dimension D10 (the ratio of the etching depth D4 to the dimension D10) is too large, the subsequently formed via may be too thick or the contact area of via-to-line may be too small, leading to high resistance.

Figure 1F:
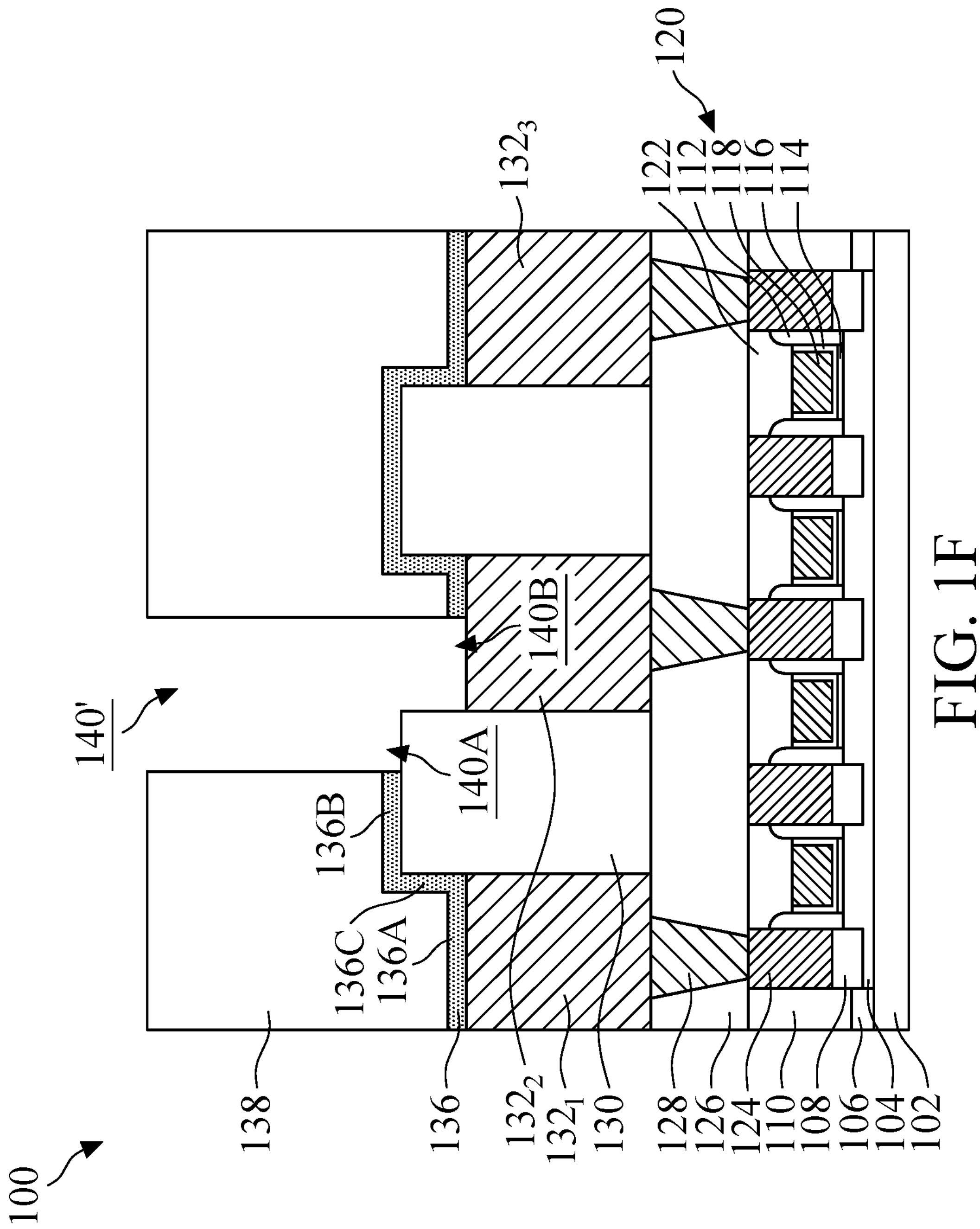

The bottom of the via opening 140 is opened using an etching process, such that the via opening 140 extends to the metal line $132_2$, as shown in FIG. 1F, in accordance with some embodiments. In some embodiments, the etching process is an anisotropic etching process such as dry plasma etching, an isotropic etching process such as dry chemical etching, remote plasma etching or wet chemical etching, and/or a combination thereof. The extended via opening 140 is referred to as a via opening 140', in accordance with some embodiments.

The via opening 140' extends through the horizontal upper portion 136B of the etching stop layer 136 to expose the upper surface of the dielectric bulk layer 138, extends through the horizontal lower portion 136A of the etching stop layer 136 to expose the upper surface of the metal line $132_2$, and extends through the vertical portion 136C of the etching stop layer 136 to expose the side surface of the dielectric bulk layer 138, in accordance with some embodiments. The via opening 140 has a first bottom surface exposing the upper surface of the dielectric bulk layer 138 and a second bottom surface exposing the upper surface of the metal line $132_2$ and located at a lower level than the first bottom surface, in accordance with some embodiments. As such, the via opening 140 has a bottom portion having a step-shaped profile, in accordance with some embodiments. In some embodiments, the intermetal dielectric layer 130 remains substantially unetched or only slightly etched during the etching process.

Figures 1, 1G:
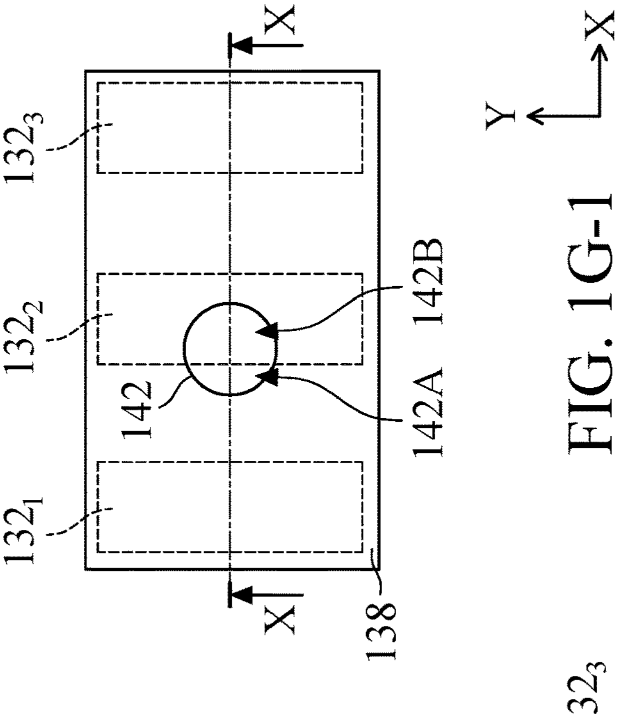
Figure 1G:
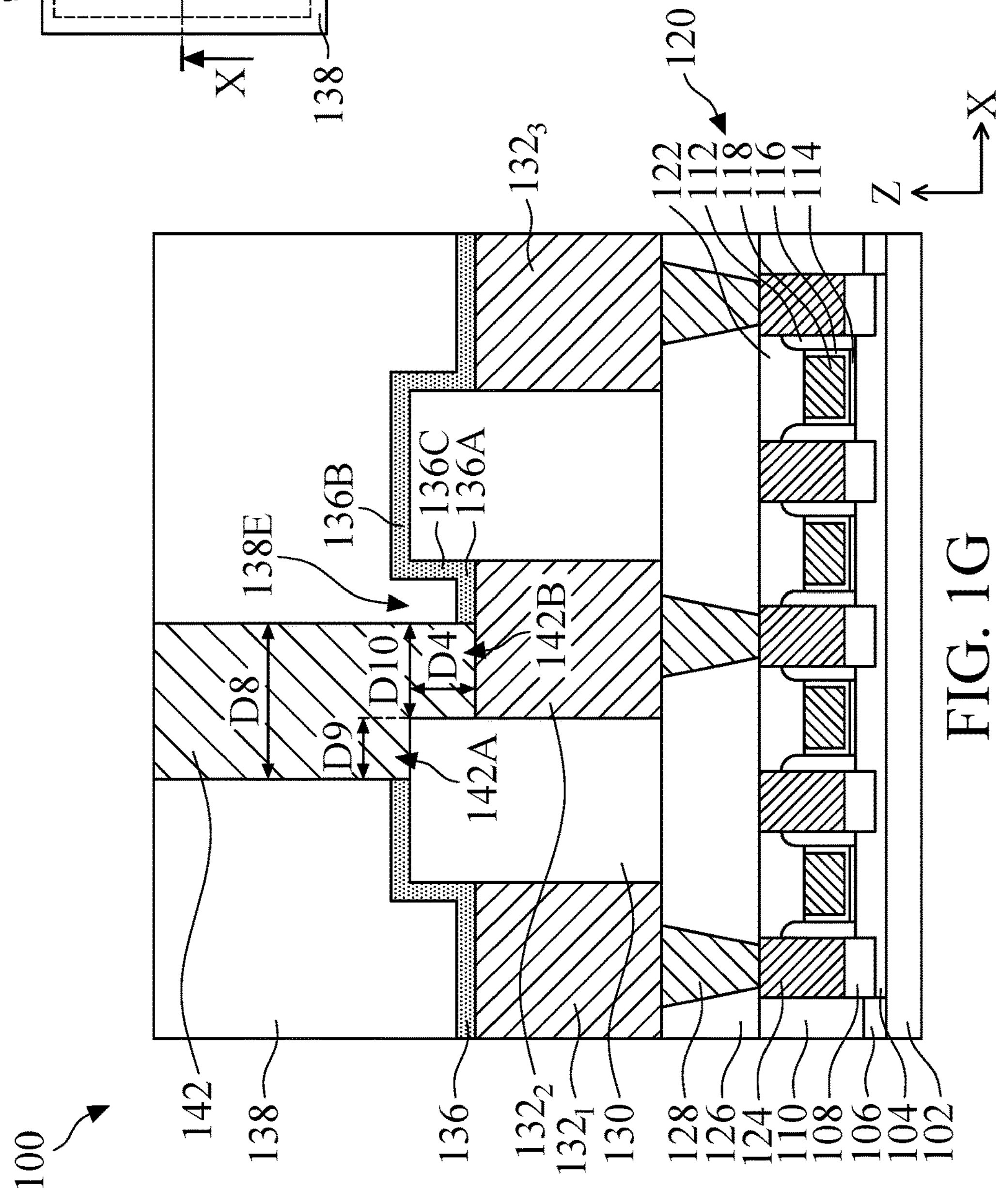

A via 142 is formed in the via opening 140', as shown in FIGS. 1G and 1G-1, in accordance with some embodiments. The via 142 lands on and contacts to the metal line $132_2$, in accordance with some embodiments. The via 142 corresponds to and is electrically connected to the metal line $132_2$ so that the via 142 is electrically connected to the source/ drain feature 108 through the metal line $132_2$, via 128 and the contact plug 124, in accordance with some embodiments. In some embodiments, the via 142, the dielectric bulk layer 138, and the etching stop layer 136 combine to form one interconnect layer of the multilayer interconnect structure that is formed over and electrically coupled to the previous interconnect layer (including the metal lines 132 and the intermetal dielectric layer 130), in accordance with some embodiments. Though the semiconductor structure 100 is depicted with one via 142, the embodiments of the present disclosure contemplate the semiconductor structure 100 having more than one via 142, which are correspondingly formed over other metal lines 132.

The formation of the via 142 includes depositing one or more conductive materials over the dielectric bulk layer 138 to fill the via opening 140', in accordance with some embodiments. In some embodiments, the conductive materials are deposited using CVD, PVD, e-beam evaporation, ALD, ECP, ELD, another suitable method, or a combination thereof. Afterwards, a planarization process such as CMP and/or an etching back process is performed on the one or more conductive materials to remove an excess portion of the conductive materials from the upper surface of the dielectric bulk layer 138. After the planarization process, the upper surfaces of the via 142 and the upper surfaces of the dielectric bulk layer 138 are substantially coplanar, in accordance with some embodiments. The planarization process may also remove the patterned hard mask layer which is used to form the via 140.

The via 142 may have a multilayer structure including, for example, liner layers, glue layers, barrier layers, seed layers, metal bulk layers, another suitable layer, and/or a combination thereof. For example, a barrier layer (not shown) may optionally be formed along the sidewall and the bottom surface of the via opening 140'. The barrier layer is used to prevent the metal from the subsequently formed metal material from diffusing into the dielectric material (e.g., the dielectric bulk layer 138 and the etching stop layer 136). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewall and the bottom surface of the via opening 140', and on the barrier layer (if formed). The glue layer is used to improve adhesion between the subsequently formed metal material and the dielectric material (e.g., the dielectric bulk layer 138 and the etching stop layer 136). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the via opening 140'. In some embodiments, the metal bulk layer is formed using a selective deposition technique such as cyclic CVD process or ELD process, and it is not necessary to form a glue layer in the trenches before depositing the metal bulk material. In some embodiments, the metal bulk layers are made of one or more conductive materials with low resistance and good gap-fill ability, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), another suitable metal material, and/or a combination thereof.

The via 142 is offset from the metal line $132_2$, in accordance with some embodiments. When viewed from FIG. 1G-1, the via 142 has a first portion 142A outside of the area of the metal line $132_2$ and a second portion 142B inside the area of the metal line $132_2$. In some embodiments, the width of the via 142 is substantially the same as the width D8. In some embodiments, the width of the via 142 is equal to or less than the width D2 (FIG. 1A) of the metal line $132_2$. In alternative embodiments, the width of the via 142 is greater than the width D2 (FIG. 1A) of the metal line $132_2$. In some embodiments, the first portion 142A of the via 142 outside of the area of the metal line $132_2$ (or exceeding the edge of the metal line $132_2$) has a dimension that is substantially the same as the dimension D9. In some embodiments, the second portion 142B of the via 142 inside the area of the metal line $132_2$ (overlapping the metal line $132_2$) has a dimension that is substantially the same as the dimension D10. The dimension of the first portion 142A of the via 142 may be greater than, equal to or less than the dimension of the second portion 142B of the via 142. The bottom surface of the first portion 142A of the via 142 is located at a higher level than the bottom surface of the second portion 142B of the via 142, in accordance with some embodiments.

The dielectric bulk layer 138 has an extension portion 138E interposing between the second portion 142B of the via 142 and the intermetal dielectric layer 130, in accordance with some embodiments. The second portion 142B of the via 142 interposes between the extension portion 138E of the dielectric bulk layer 138 and the intermetal dielectric layer 130, in accordance with some embodiments.

As the scale of the semiconductor devices continues to shrink, one of the design challenges of the semiconductor devices is to improve the via-to-line overlay window and/or the via critical dimension (CD) window of the photolithography process for forming the via. In instances of the via opening being offset from the corresponding metal line, the resulting via is formed close to a neighboring metal line. In such cases, the minimum distance between the resulting via and the neighboring metal line is reduced, which may lead to the leakage between the resulting via and the neighboring metal line. Therefore, the reliability and performance of the semiconductor device may be degraded.

In some embodiments where the via opening 140 (or 140') is offset from the metal line $132_2$, by recessing the metal lines 132, the first portion 142A of the via 142 exceeding the edge of the metal line $132_2$ is raised and located at a higher level than the second portion 142B of the via 142 overlapping the metal line $132_2$. As a result, it is avoided that the minimum distance between the via 142 and the neighboring metal line $132_1$ becomes shorter. Therefore, the via-to-line overlay window of the photolithography process for forming the via 142 may be improved, which may relax the strict control/specification limits of the photolithography process. In addition, the leakage between the via and line may be less of concern and TDDB (time-dependent dielectric breakdown) window may be improved. Therefore, the reliability and the yield of the resulting semiconductor device may be improved.

Figures 1, 1H:
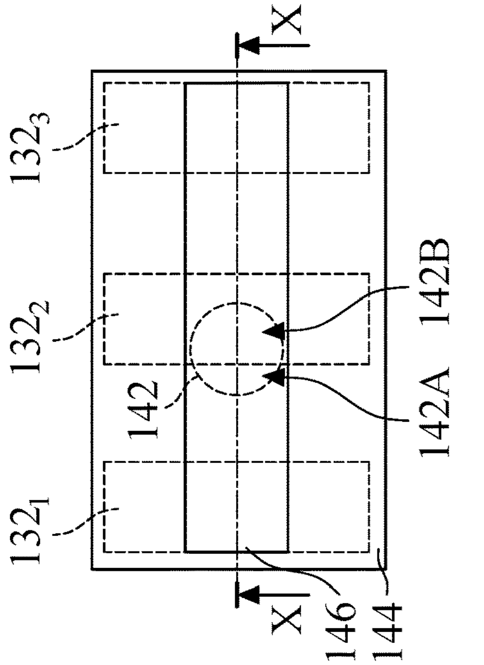
Figure 1H:
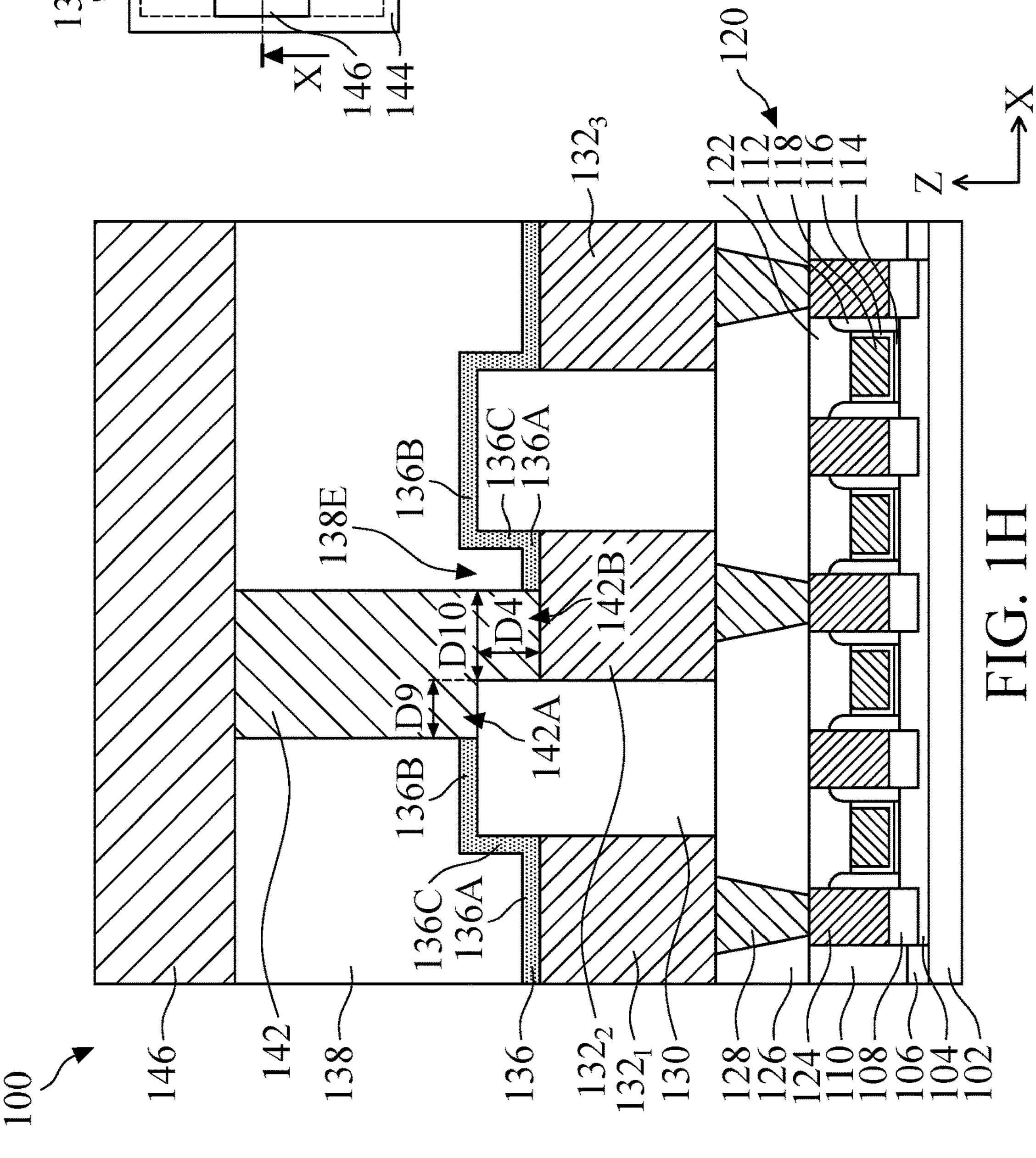

An (a third) intermetal dielectric layer 144 is formed over the dielectric bulk layer 138 and the via 142, and a metal line 146 is then formed through the intermetal dielectric layer 144, as shown in FIGS. 1H and 1H-1, in accordance with some embodiments. In some embodiments, the metal line 146 and the intermetal dielectric layer 144 combine to form one interconnect layer of the multilayer interconnect structure that is formed over and electrically coupled to the previous interconnect layer (including the via 142, the dielectric bulk layer 138 and the etching stop layer 136). The metal line 146 corresponds to and is electrically connected to the via 142, in accordance with some embodiments. In some embodiments, the metal line 146 extends in the X direction. Though the semiconductor structure 100 is depicted with one metal line 146, the embodiments of the present disclosure contemplate the semiconductor structure 100 having more than one metal line 146.

In some embodiments, the intermetal dielectric layer 144 is made of one or more dielectric materials, such as silicon oxide (SiO), silicon nitride (SiN), silicon oxynitride (SiON), silicon carbide (SiC), aluminum oxide ($Al_2O_3$), dielectric material(s) with low dielectric constant (low-k) such as SiCOH, SiOCN, and/or SiOC, and/or a combination thereof. In some embodiments, the intermetal dielectric layer 144 is made of an ELK dielectric material with a dielectric constant (k) less than about 3.0, or even less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide (SiO 2). In some embodiments, the intermetal dielectric layer 144 is formed using CVD (such as LPCVD, HARP, and FCVD), ALD, spin-on coating, another suitable method, or a combination thereof. A post-curing process (e.g., UV curing) may be performed on the as-deposited ELK dielectric material for the intermetal dielectric layer to form a porous structure.

In some embodiments, the intermetal dielectric layer 144 is made of a single, continuous material. In some embodiments, the intermetal dielectric layer 144 may be a multilayer structure. For example, the intermetal dielectric layer 144 may include a bottom lining layer serving as an etching stop layer and a bulk layer having low-k dielectric constant over the bottom lining layer. The bottom lining layer may be made of a dielectric material having a different etching selectivity from the bulk layer.

In some embodiments, the formation of the metal line 146 includes patterning the intermetal dielectric layer 144 to form a trench (where the metal line 146 is to be formed) through the intermetal dielectric layer 144 and exposing the via 142. The patterning process may include forming a patterned mask layer (such as a photoresist layer and/or a hard mask layer, not shown) on the intermetal dielectric layer 144, and etching the intermetal dielectric layer 144 uncovered by the patterned mask layer. For example, a photoresist may be formed on the intermetal dielectric layer 144, such as by using spin-on coating, and patterned with patterns corresponding to the trenches by exposing the photoresist to light using an appropriate photomask. Exposed or unexposed portions of the photoresist may be removed depending on whether a positive or negative resist is used.

The pattern of the photoresist may then be transferred to the intermetal dielectric layer 144, such as by using one or more suitable etch processes. The photoresist can be removed in an ashing or wet strip process, for example. Alternatively, a hard mask layer may be formed on the intermetal dielectric layer 144. The hard mask layer may include, or be formed of, a nitrogen-free anti-reflection layer (NFARL), carbon-doped silicon dioxide (e.g., $SiO_2$:C), titanium nitride (TiN), titanium oxide (TiO), boron nitride (BN), a multilayer thereof, another suitable material, and/or a combination thereof. The hard mask layer may be patterned using photolithography and etching processes described above to have a pattern corresponding to the trench. The patterned hard mask layer may transfer the pattern to the intermetal dielectric layer 144 to form the trench, which may be accomplished by using one or more suitable etch processes. The etch processes may include dry etching such as a reactive ion etch (RIE), neutral beam etch (NBE), inductive coupled plasma (ICP) etch, another suitable method, or a combination thereof. The etch processes may be anisotropic.

One or more conductive materials for the metal line 146 are then deposited over the intermetal dielectric layer 144 to fill the trench. In some embodiments, the conductive material is deposited using CVD, PVD, e-beam evaporation, ALD, electroplating (ECP), electroless deposition (ELD), another suitable method, or a combination thereof. Afterwards, a planarization process such as CMP and/or an etching back process is performed on the one or more conductive materials to remove an excess portion of the conductive materials from the upper surface of the intermetal dielectric layer 144. After the planarization process, the upper surface of the metal lines 144 and the upper surface of the intermetal dielectric layer 144 are substantially coplanar, in accordance with some embodiments. The planarization process may also remove the patterned hard mask layer.

The metal line 146 may have a multilayer structure including, for example, liner layers, glue layers, barrier layers, seed layers, metal bulk layers, another suitable layer, and/or a combination thereof. For example, a barrier layer (not shown) may optionally be formed along the sidewall and the bottom surface of the trench. The barrier layer is used to prevent the metal from the subsequently formed metal material from diffusing into the dielectric material (e.g., the intermetal dielectric layer 144). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewall and the bottom surface of the trench, and on the barrier layer (if formed). The glue layer is used to improve adhesion between the subsequently formed metal material and the dielectric material (e.g., the intermetal dielectric layer 144). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the trench. In some embodiments, the metal bulk layer is formed using a selective deposition technique such as cyclic CVD process or ELD process, and it is not necessary to form a glue layer in the trenches before depositing the metal bulk material. In some embodiments, the metal bulk layers are made of one or more conductive materials with low resistance and good gap-fill ability, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), another suitable metal material, and/or a combination thereof.

After the metal line 146 is formed, additional interconnect layers (including such as intermetal dielectric layers and electrically conductive features e.g., metal lines and vias) of the multilayer interconnect structure may be formed over the semiconductor structure 100 to produce a semiconductor device. Furthermore, the aspect of the embodiments for forming the interconnect layers described above with respect to FIGS. 1A to 1H may also be used for the additional overlying interconnect layers.

Figures 1, 2A:
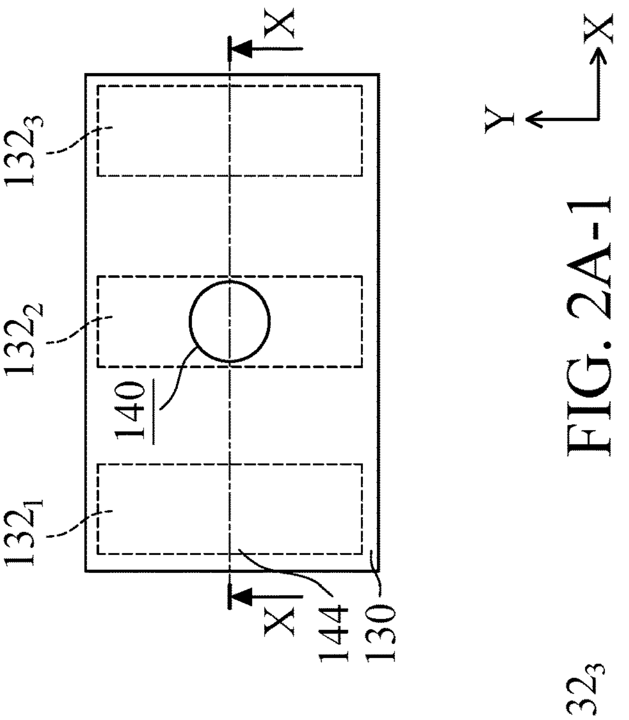
Figure 2A:
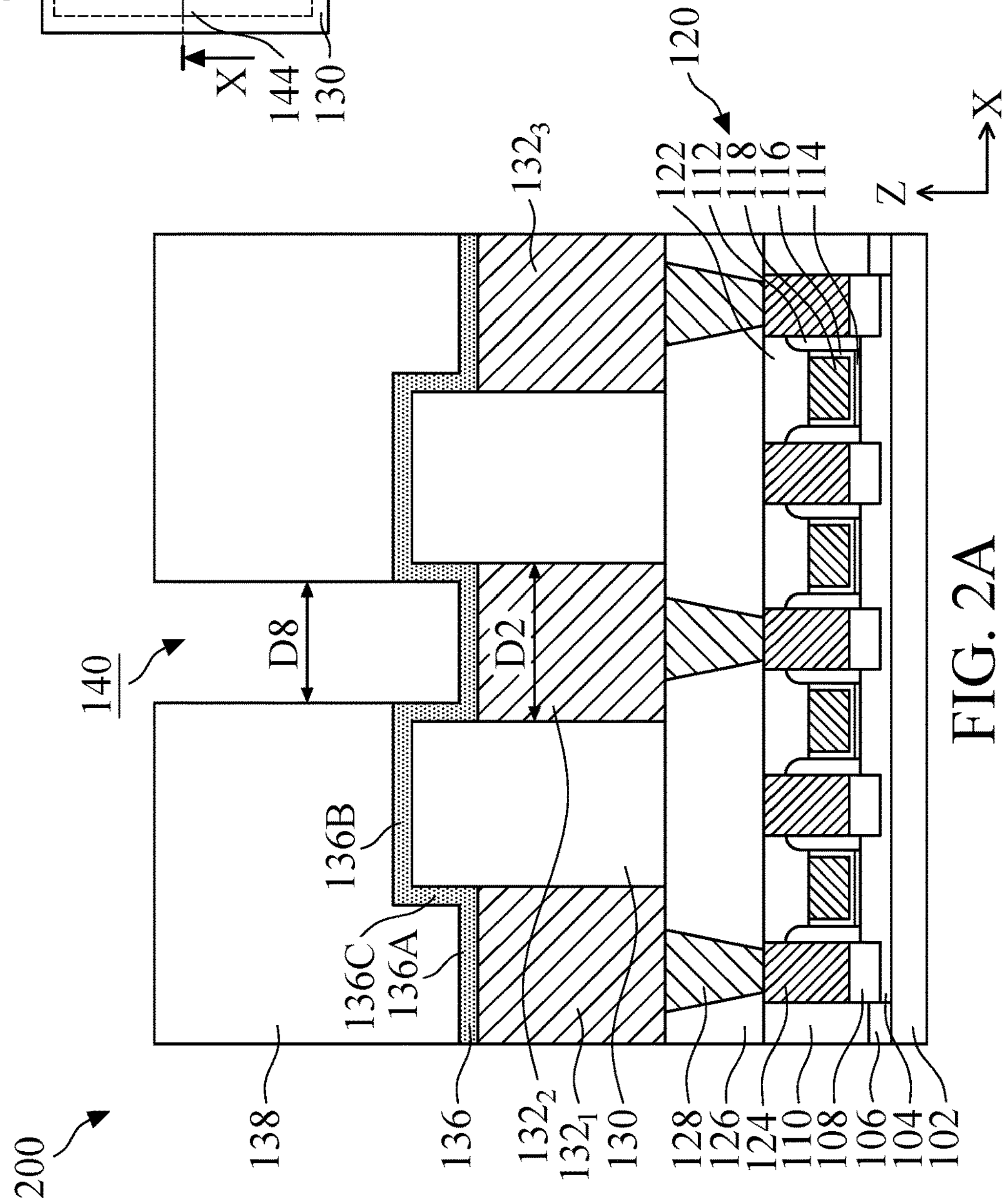
FIGS. 2A-2C are cross-sectional views illustrating the formation of a semiconductor structure at various intermediate stages, in accordance with some embodiments of the disclosure.
Figure 2B:
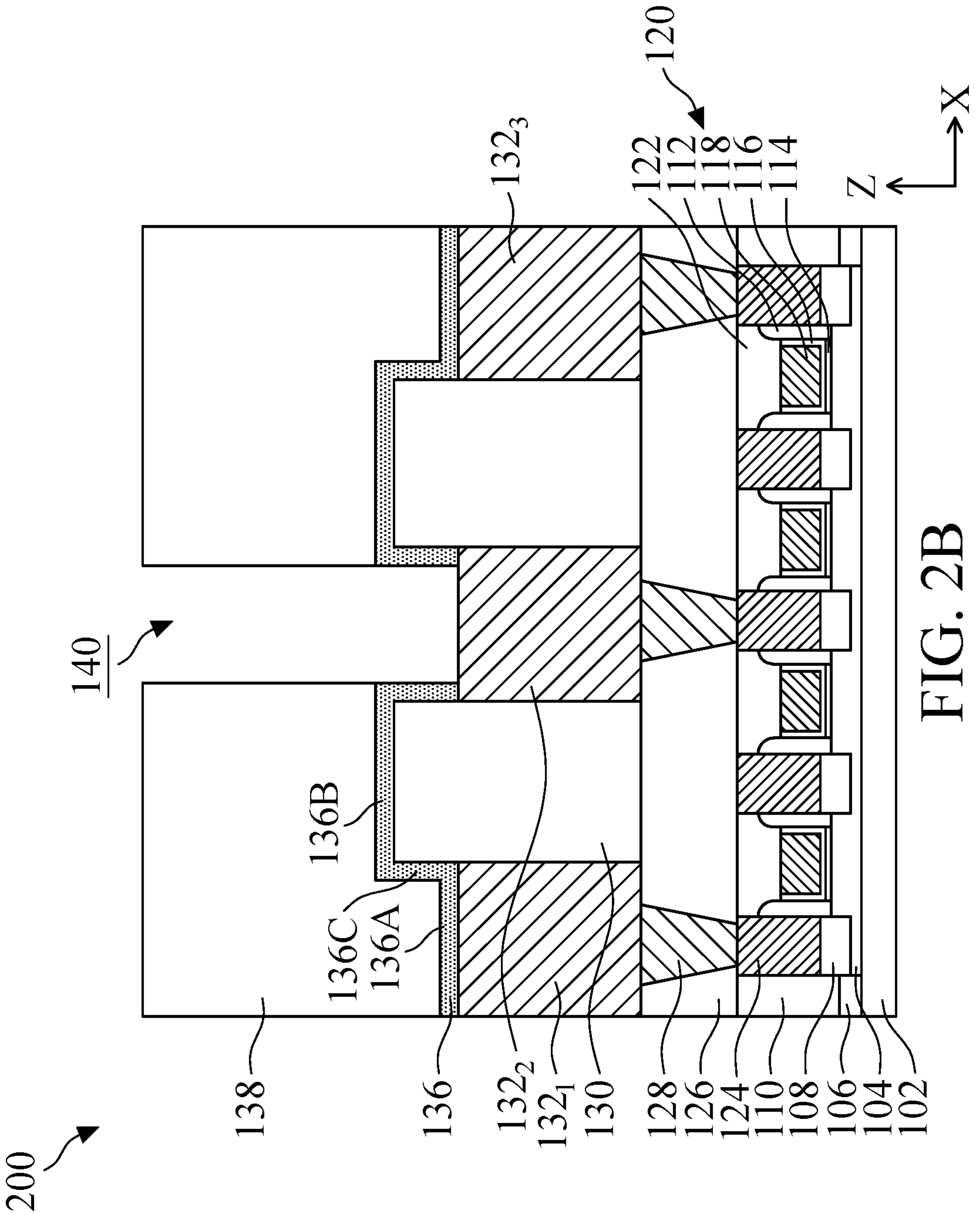
Figures 1, 2C:
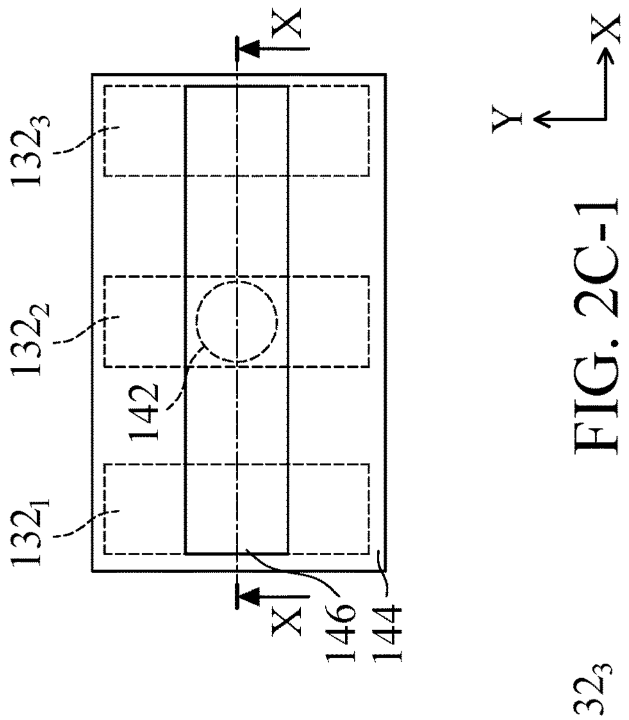
Figure 2C:
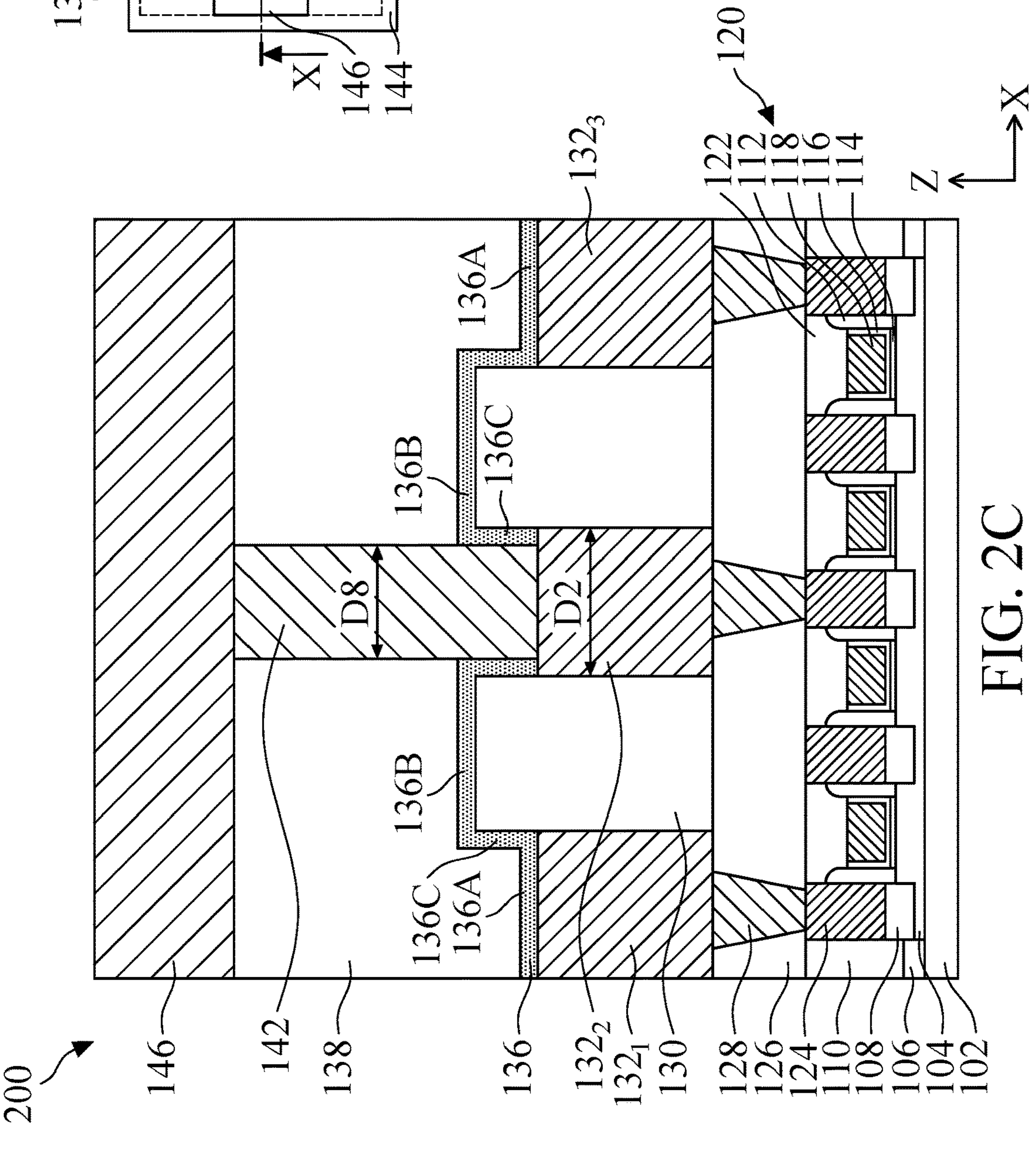

FIGS. 2A-2C are cross-sectional views illustrating the formation of a semiconductor structure 200 at various intermediate stages, in accordance with some embodiments. FIGS. 2A-1 and 2C-1 are plan views illustrating the formation of the semiconductor structure 200 at various intermediate stages, in which FIGS. 2A and 2C correspond to cross-section X-X shown in FIGS. 2A-1 and 2C-1, respectively, in accordance with some embodiments. The embodiments of the FIGS. 2A-2C are similar to the embodiments of the FIGS. 1A-1H, except that the via opening is aligned with the metal line.

Continuing from FIG. 1D, a via opening 140 is formed through the dielectric bulk layer 138, as shown in FIGS. 2A and 2A-1, in accordance with some embodiments. The via opening 140 corresponds to and is aligned with the metal line $\mathbf{132_2}$, in accordance with some embodiments. The formation of the via opening 140 may be the same as or similar to the via opening 140 described above with respect to FIG. 1E. When viewed from FIG. 2A-1, the via opening 140 is entirely inside the area of the metal line $\mathbf{132_2}$. The via opening 140 exposes the horizontal lower portion 136A and the vertical portion 136C of the etching stop layer 136, but most of the horizontal upper portion 136B, in accordance with some embodiments. In some embodiments, the width D8 of the via opening 140 is less than the width D2 of the metal line $\mathbf{132_2}$.

The bottom of the via opening 140 is opened using an etching process, such that the via opening 140 extends to the metal line $\mathbf{132_2}$, as shown in FIG. 2B, in accordance with some embodiments. The extended via opening 140 is referred to as a via opening 140', in accordance with some embodiments. The etching process may be the same as or similar to that described above with respect to FIG. 1F. The via opening 140' extends through the horizontal lower portion 136A of the etching stop layer 136 to expose the upper surface of the metal line $\mathbf{132_2}$, in accordance with some embodiments. In some embodiments, the vertical portion 136C of the etching stop layer 136 remains covering the side surfaces of the dielectric bulk layer 138 after the etching process, in accordance with some embodiments.

A via 142 is formed in the via opening 140', as shown in FIGS. 2C and 2C-1, in accordance with some embodiments. The material and the formation method of the via 142 may be the same as or similar to the via 142 described above with respect to FIG. 1G. The via 142 is aligned over the metal line $\mathbf{132_2}$, in accordance with some embodiments. When viewed from FIG. 2C-1, the via 142 is entirely inside the area of the metal line $\mathbf{132_2}$. In some embodiments, the bottom portion of the via 142 is surrounded by the vertical portion 136B of the etching stop layer 136.

An (a third) intermetal dielectric layer 144 is formed over the dielectric bulk layer 138 and the via 142, and a metal line 146 is then formed through the intermetal dielectric layer 144, as shown in FIGS. 2C and 2C-1, in accordance with some embodiments. The materials and the formation methods of the intermetal dielectric layer 144 and the metal line 146 may be the same as or similar to the intermetal dielectric layer 144 and the metal line 146 described above with respect to FIG. 1H.

Figures 1, 3A:
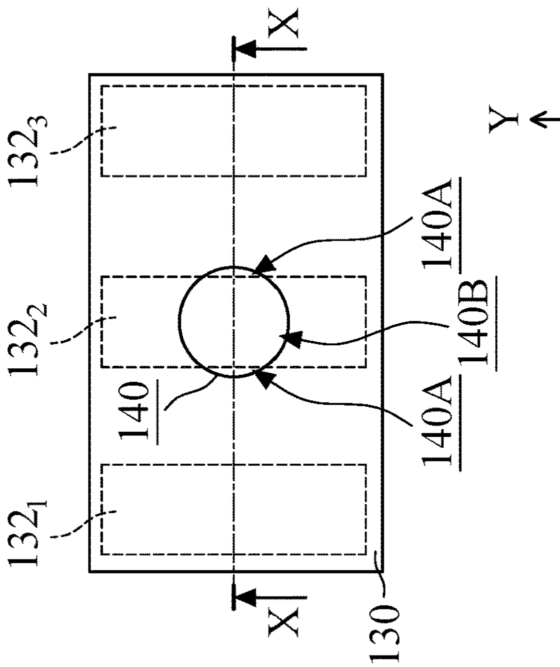
Figure 3A:
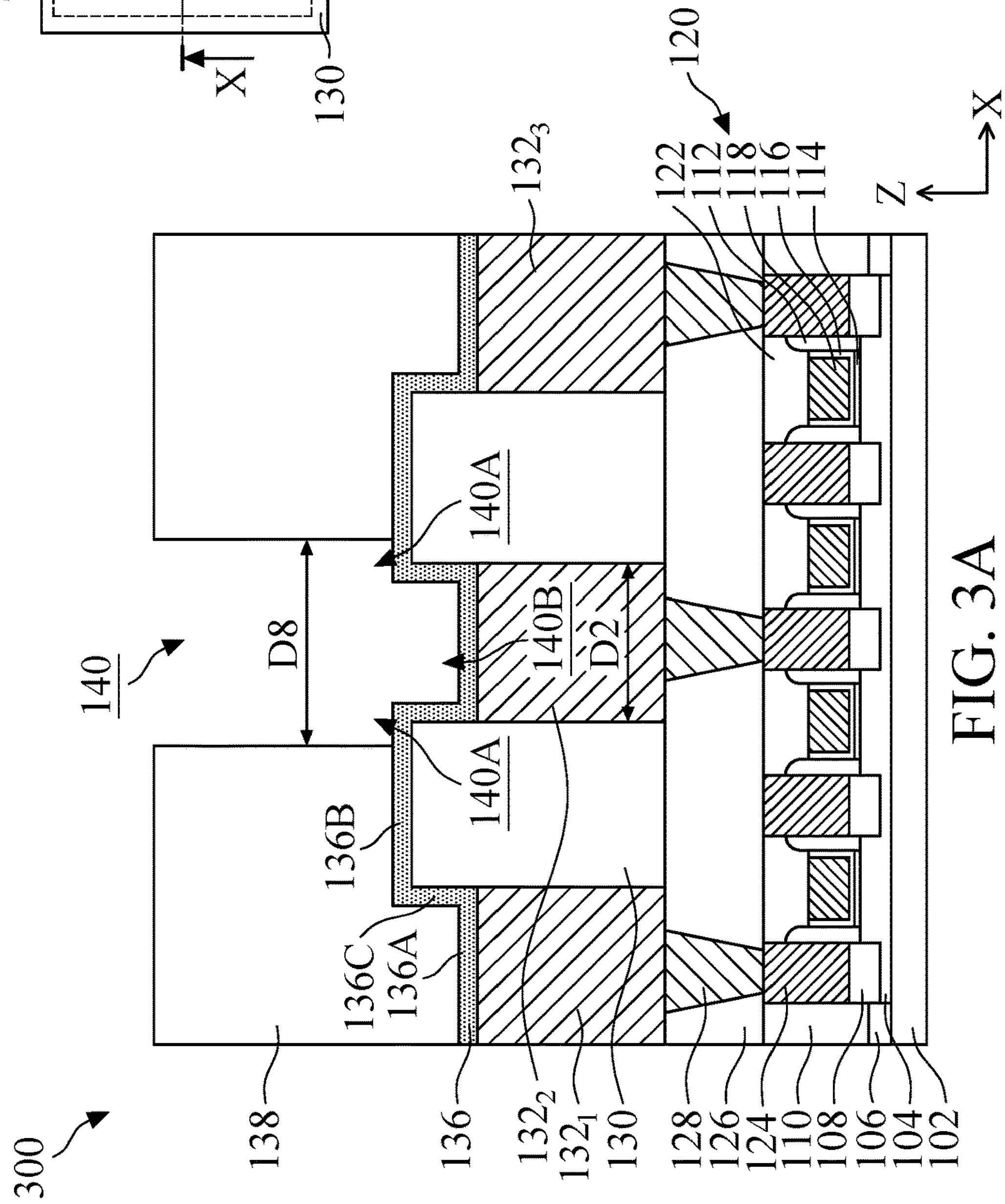
FIGS. 3A-3C are cross-sectional views illustrating the formation of a semiconductor structure at various intermediate stages, in accordance with some embodiments of the disclosure.
Figure 3B:
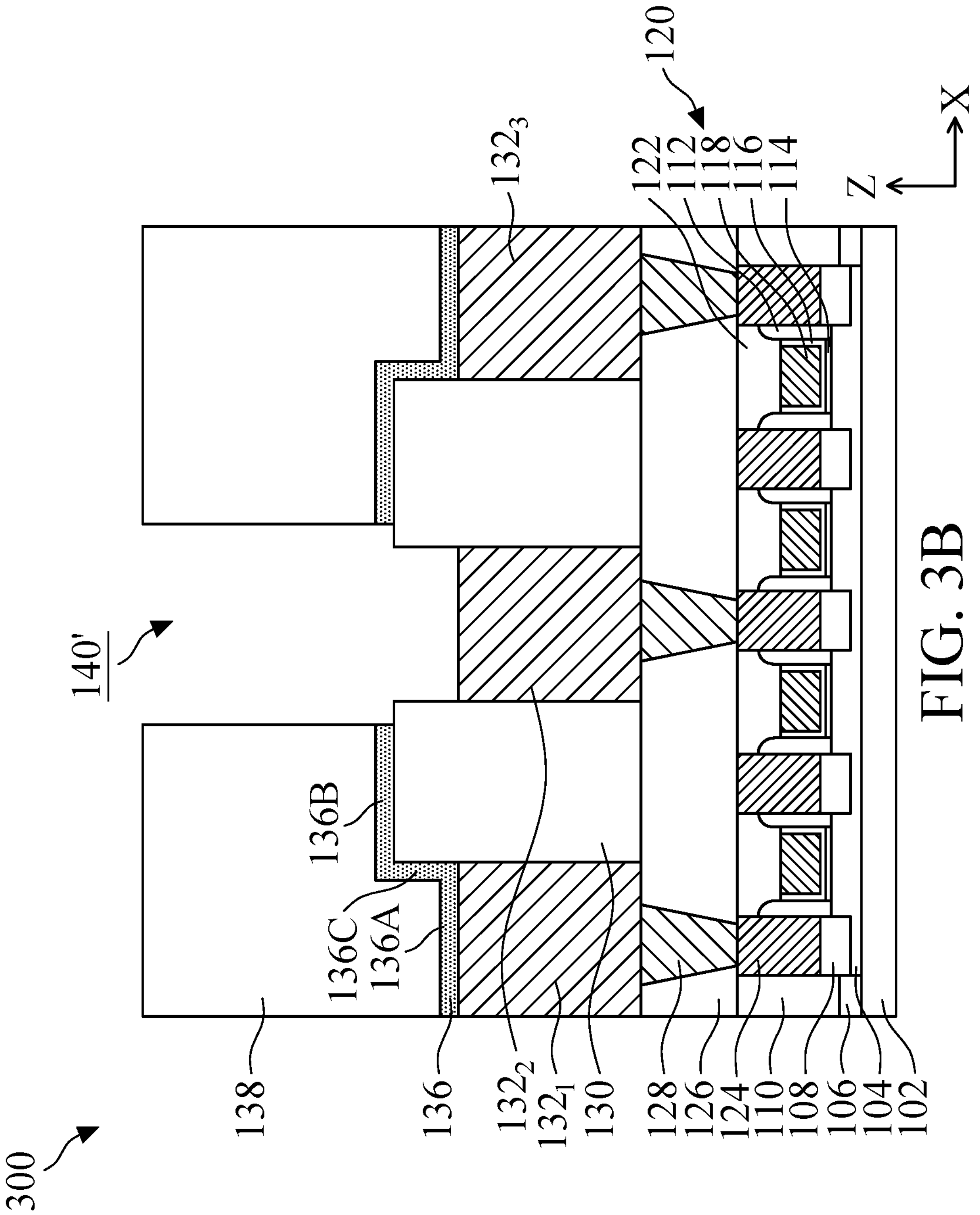
Figures 1, 3C:
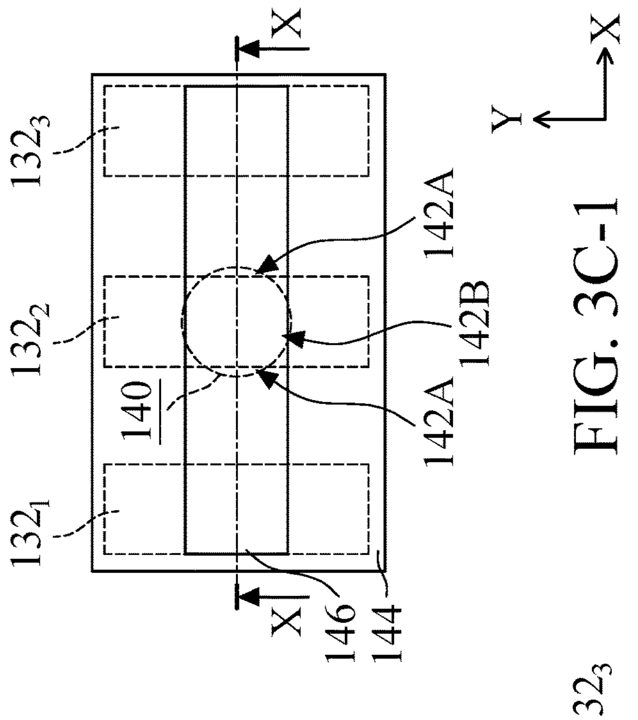
Figure 3C:
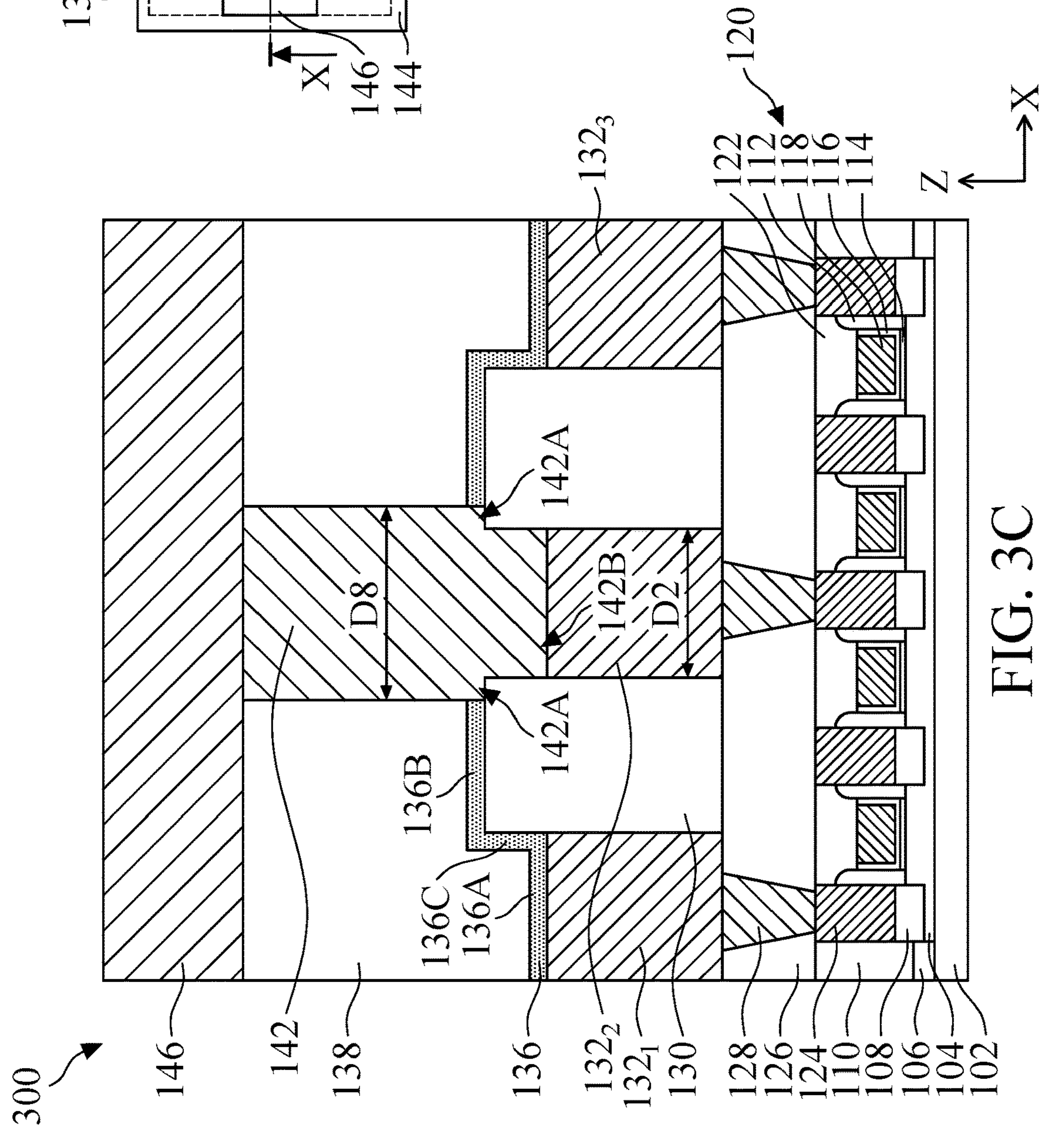

FIGS. 3A-3C are cross-sectional views illustrating the formation of a semiconductor structure 300 at various intermediate stages, in accordance with some embodiments. FIGS. 3A-1 and 3C-1 are plan views illustrating the formation of the semiconductor structure 300 at various intermediate stages, in which FIGS. 3A and 3C correspond to cross-section X-X shown in FIGS. 3A-1 and 3C-1, respectively, in accordance with some embodiments. The embodiments of the FIGS. 3A-3C are similar to the embodiments of the FIGS. 2A-2C, except that the width of the via is greater than the width of the metal line.

Continuing from FIG. 1D, a via opening 140 is formed through the dielectric bulk layer 138, as shown in FIGS. 3A and 3A-1, in accordance with some embodiments. The via opening 140 corresponds to and is aligned with the metal line $\mathbf{132_2}$, in accordance with some embodiments. The formation of the via opening 140 may be the same as or similar to the via opening 140 described above with respect to FIG. 1E. When viewed from FIG. 3A-1, the via opening 140 has a first portion 140A outside of the area of the metal line $\mathbf{132_2}$ and at the opposite sides of the metal line $\mathbf{132_2}$ and a second portion 140B inside the area of the metal line $\mathbf{132_2}$, in accordance with some embodiments. In some embodiments, the width D8 of the via opening 140 is greater than the width D2 of the metal line $\mathbf{132_2}$. The bottom of the via opening 140 is opened using an etching process, such that the via opening 140 extends to the metal line $\mathbf{132_2}$, as shown in FIG. 3B, in accordance with some embodiments. The extended via opening 140 is referred to as a via opening 140', in accordance with some embodiments. The etching process may be the same as or similar to that described above with respect to FIG. 1F.

A via 142 is formed in the via opening 140', as shown in FIGS. 3C and 3C-1, in accordance with some embodiments. The material and the formation method of the via 142 may be the same as or similar to the via 142 described above with respect to FIG. 1G. The via 142 is aligned over the metal line $\mathbf{132_2}$, in accordance with some embodiments. When viewed from FIG. 3C-1, the via 142 has a first portion 142A outside of the area of the metal line $\mathbf{132_2}$ and at the opposite sides of the metal line $\mathbf{132_2}$ and a second portion 142B inside the area of the metal line $\mathbf{132_2}$, in accordance with some embodiments. In some embodiments, the bottom portion of the via 142 is surrounded by the intermetal dielectric layer 130 and the upper portion of the via 142 is surrounded by the intermetal dielectric layer including the dielectric bulk layer 138 and the etching stop layer 136. In some embodiments, the upper portion of the via 142 is wider than the bottom portion of the via 142.

An (a third) intermetal dielectric layer 144 is formed over the dielectric bulk layer 138 and the via 142, and a metal line 146 is then formed through the intermetal dielectric layer 144, as shown in FIGS. 3C and 3C-1, in accordance with some embodiments. The materials and the formation methods of the intermetal dielectric layer 144 and the metal line 146 may be the same as or similar to the intermetal dielectric layer 144 and the metal line 146 described above with respect to FIG. 1H.

In instances of the CD of the via opening being greater than the CD of the corresponding metal line, the resulting via is formed close to a neighboring metal line. In such cases, the minimum distance between the resulting via and the neighboring metal line is reduced, which may lead to the leakage between the resulting via and the neighboring metal line. Therefore, the reliability and performance of the semiconductor device may be degraded.

In some embodiments where the width of the via opening 140 (or 140') is greater than the width of the metal line $\mathbf{132_2}$, by recessing the metal lines 132, the first portion 142A of the via 142 exceeding the edge of the metal line $132_2$ is raised and located at a higher level than the second portion 142B of the via 142 overlapping the metal line $132_2$. As a result, it is avoided that the minimum distance between the via 142 and the neighboring metal line $132_1$ (and/or $132_3$) becomes shorter. Therefore, the via CD window of the photolithography process for forming the via 142 may be improved, which may relax the strict control/specification limits of the photolithography process. In addition, the leakage between the via and line may be less of concern and TDDB window may be improved. Therefore, the reliability and the yield of the resulting semiconductor device may be improved.

Figures 1, 4A:
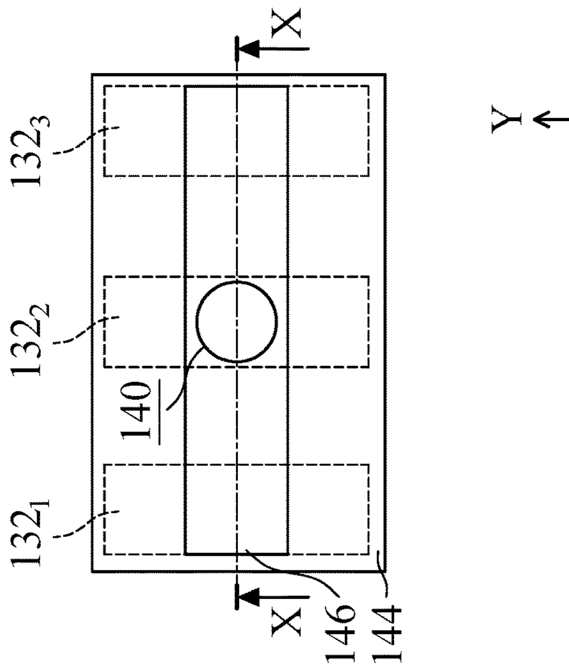
Figure 4A:
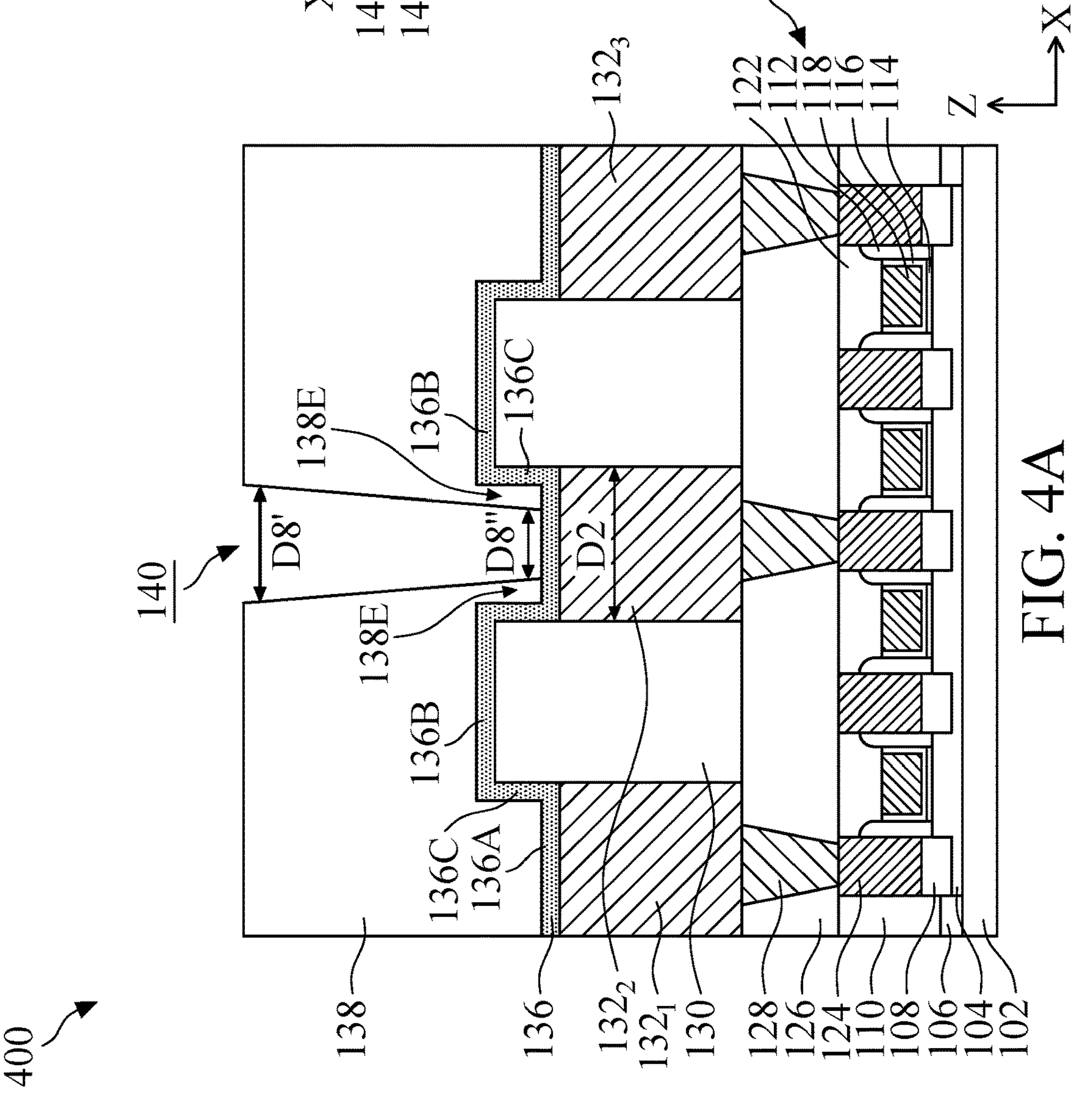
FIGS. 4A-4C are cross-sectional views illustrating the formation of a semiconductor structure at various intermediate stages, in accordance with some embodiments of the disclosure.
Figure 4B:
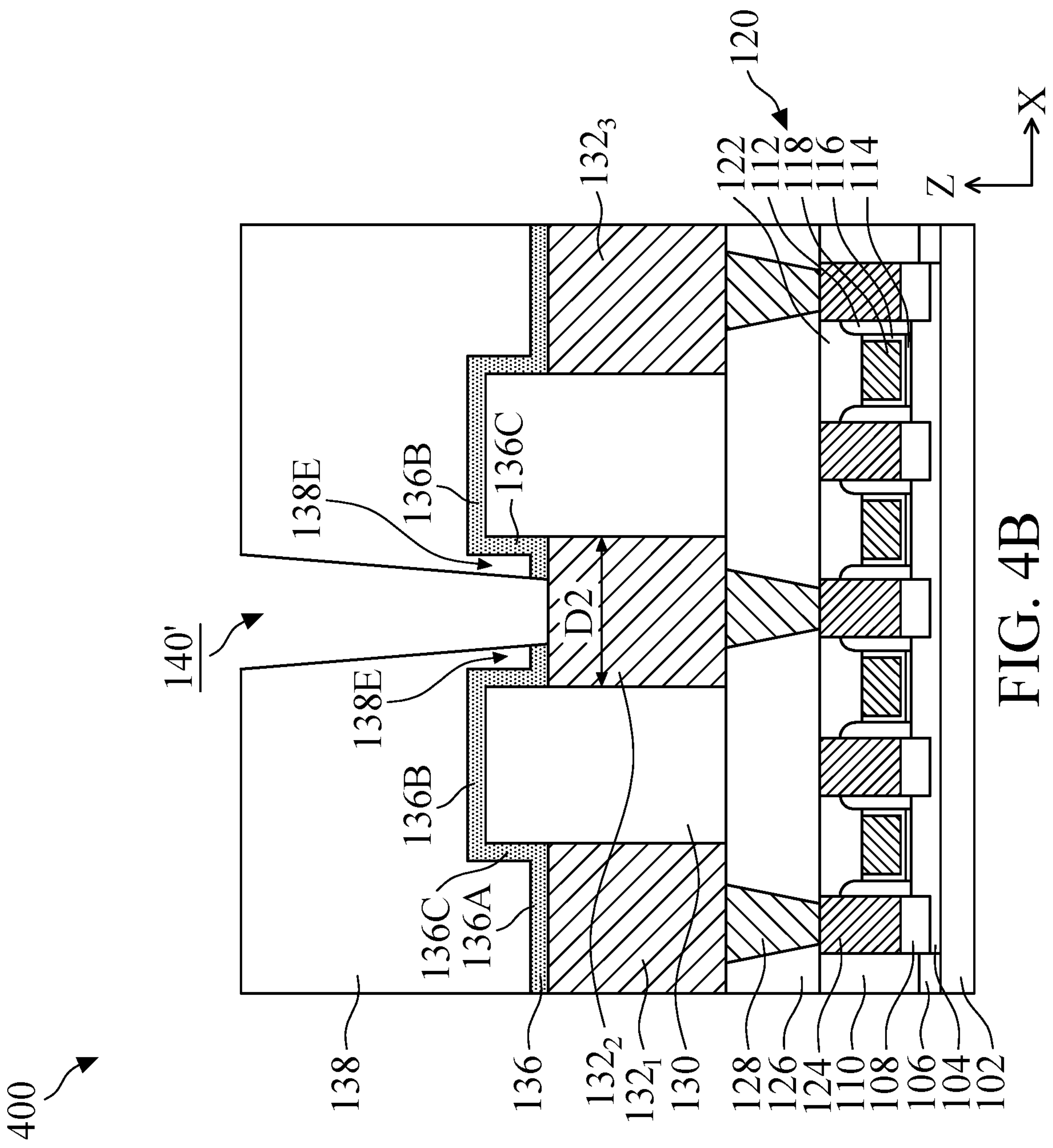
Figures 1, 4C:
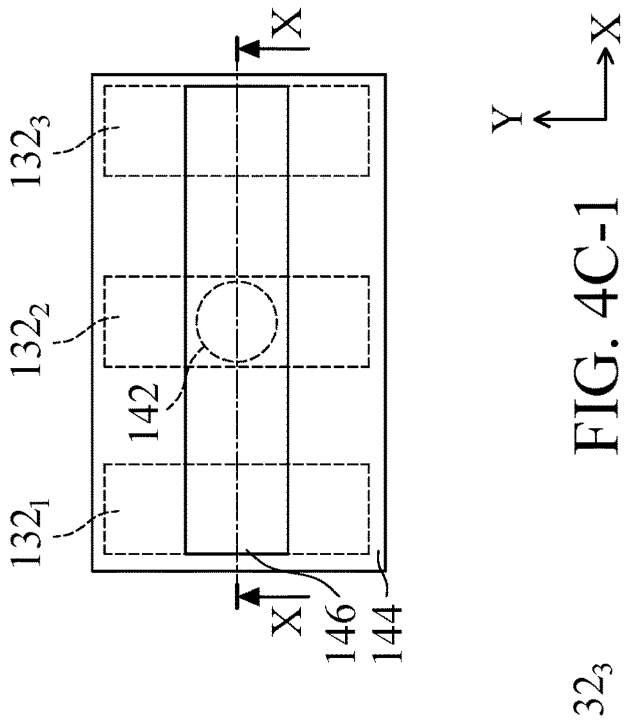
Figure 4C:
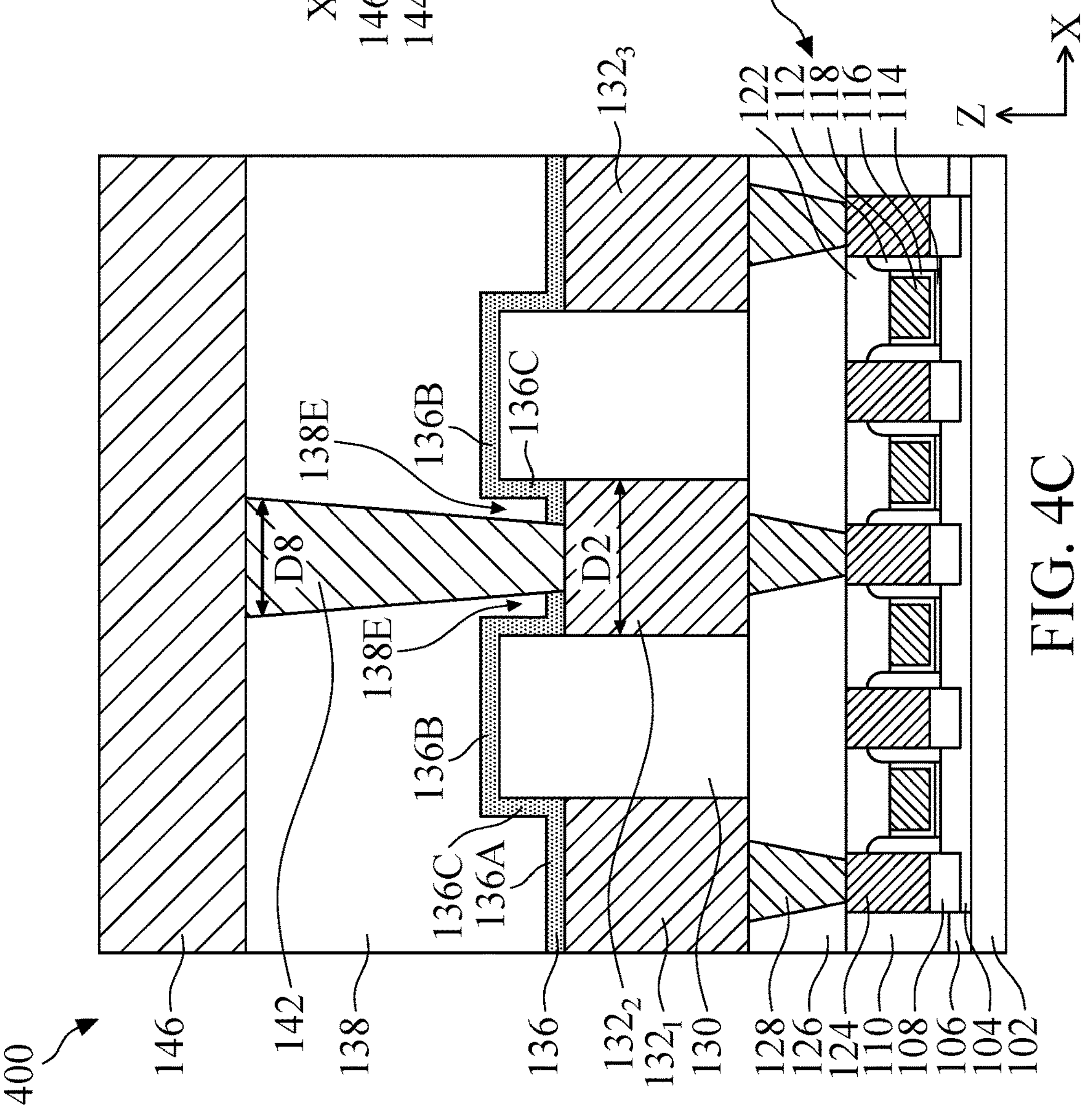

FIGS. 4A-4C are cross-sectional views illustrating the formation of a semiconductor structure 400 at various intermediate stages, in accordance with some embodiments. FIGS. 4A-1 and 4C-1 are plan views illustrating the formation of the semiconductor structure 400 at various intermediate stages, in which FIGS. 4A and 4C correspond to cross-section X-X shown in FIGS. 4A-1 and 4C-1, respectively, in accordance with some embodiments. The embodiments of the FIGS. 4A-4C are similar to the embodiments of the FIGS. 2A-2C, except that the via has a tapered profile.

Continuing from FIG. 1D, a via opening 140 is formed through the dielectric bulk layer 138, as shown in FIGS. 4A and 4A-1, in accordance with some embodiments. The via opening 140 corresponds to and is aligned with the metal line $132_2$, in accordance with some embodiments. The formation of the via opening 140 may be the same as or similar to the via opening 140 described above with respect to FIG. 1E. When viewed from FIG. 4A-1, the via opening 140 is entirely inside the area of the metal line $132_2$. The via opening 140 exposes the horizontal lower portion 136A of the etching stop layer 136, but not the horizontal upper portion 136B and the vertical portion 136C, in accordance with some embodiments. In some embodiments, the via opening 140 has a downwardly tapered profile. In some embodiments, the width D8' of the via opening 140 at the top of the via opening 140 is equal to or less than the width D2 of the metal line $132_2$. In some embodiments, the width D8" of the via opening 140 at the bottom of the via opening 140 is less than the width D2 of the metal line $132_2$.

The bottom of the via opening 140 is opened using an etching process, such that the via opening 140 extends to the metal line $132_2$, as shown in FIG. 4B, in accordance with some embodiments. The extended via opening 140 is referred to as a via opening 140', in accordance with some embodiments. The etching process may be the same as or similar to that described above with respect to FIG. 1F.

A via 142 is formed in the via opening 140', as shown in FIGS. 4C and 4C-1, in accordance with some embodiments. The material and the formation method of the via 142 may be the same as or similar to the via 142 described above with respect to FIG. 1G. The via 142 is aligned over the metal line $132_2$, in accordance with some embodiments. When viewed from FIG. 4C-1, the via 142 is entirely inside the area of the metal line $132_2$. The dielectric bulk layer 138 has an extension portion 138E surrounded by the vertical portion 136C of the etching stop layer 136, in accordance with some embodiments. In some embodiments, the bottom portion of the via 142 is surrounded by the extension portion 138E of the dielectric bulk layer 138.

An (a third) intermetal dielectric layer 144 is formed over the dielectric bulk layer 138 and the via 142, and a metal line 146 is then formed through the intermetal dielectric layer 144, as shown in FIGS. 4C and 4C-1, in accordance with some embodiments. The materials and the formation methods of the intermetal dielectric layer 144 and the metal line 146 may be the same as or similar to the intermetal dielectric layer 144 and the metal line 146 described above with respect to FIG. 1H.

Figure 5:
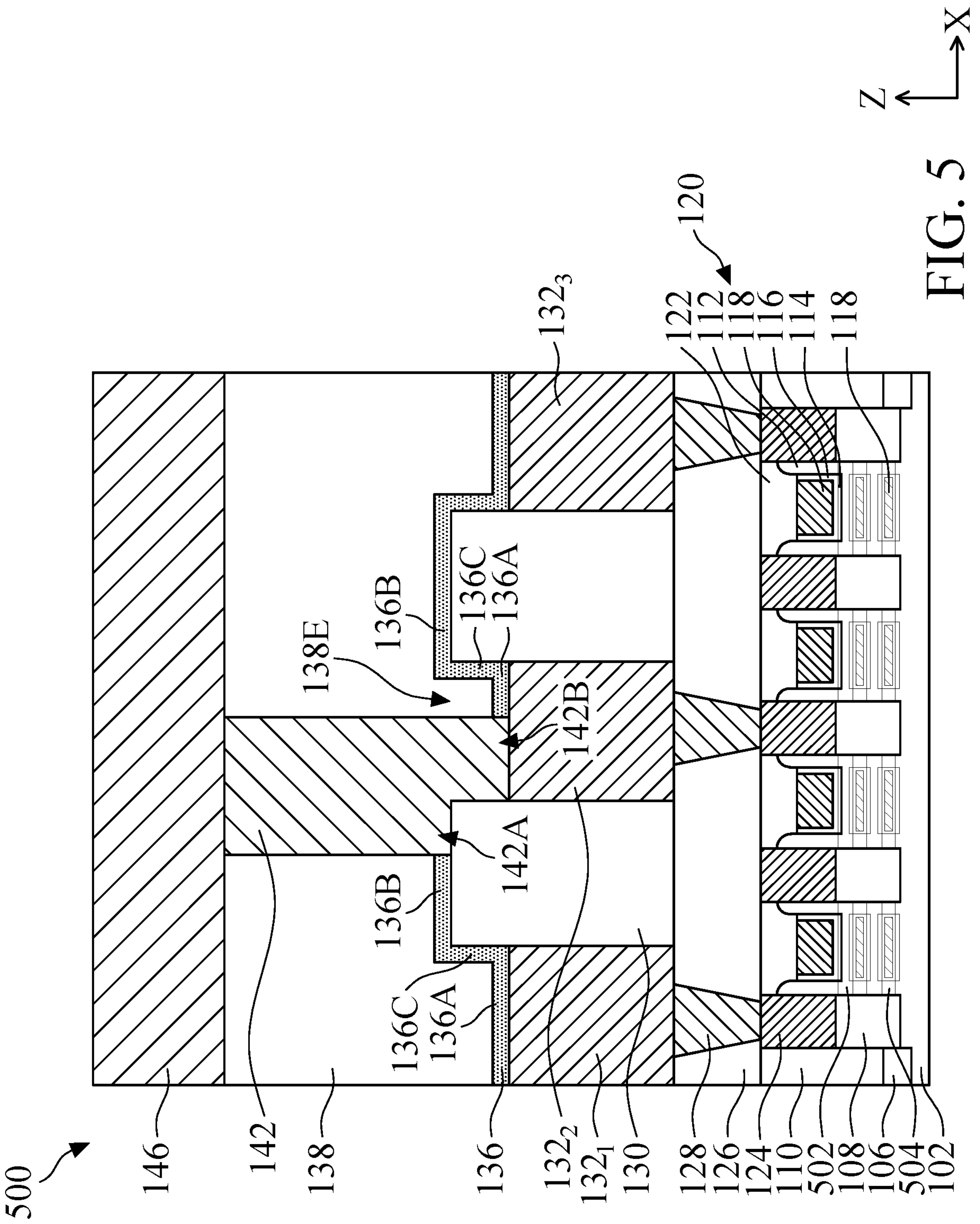
FIG. 5 is a cross-sectional view illustrating the formation of a semiconductor structure, in accordance with some embodiments of the disclosure.

The disclosed FinFET embodiments could also be applied to nanostructure devices such as nanostructure (e.g., nanosheet, nanowire, gate-all-around (GAA), or the like) field effect transistors (NSFETs). FIG. 5 illustrates a cross-sectional view of a NSFET structure including a gate-all-around field effect transistor (GAAFET) device and a multilayer interconnect structure thereon.

In some embodiments, the fin structure 104 (not shown in FIG. 5) is formed by patterning a stack of alternating layers of channel layers 502 and sacrificial layers (not shown). In some embodiments, the sacrificial layers are made of SiGe, and the channel layers 502 are made of pure or substantially pure silicon. Dummy gate structures, gate spacer layers 112, source/drain features 108 and lower interlayer dielectric layer 110 are formed in a manner similar to the above-described embodiments. Before the source/drain features 108 are formed, inner spacers 504 are formed between the channel layers 502 and below the gate spacer layers 112 by laterally recessing the sacrificial layers to form notches and depositing dielectric materials in the notches, in accordance with some embodiments. After the dummy gate stacks are removed, the sacrificial layers can be fully removed, thereby exposing four main surfaces of the channel layers 502, in accordance with some embodiments. The channel layers 502 form nanostructures (e.g., nanowires or nanosheets) that function as channel layers of the GAAFET device, in accordance with some embodiments. The gate stacks 120 and the mask layers 122 are formed in a manner similar to the above-described embodiments. The gate stacks 120 wrap around the exposed surface of the nanostructures 502.

A multilayer interconnect structure including the contact plugs 124, the interlayer dielectric layer 126, vias 128, the intermetal dielectric layer 130, the metal lines 132, the etching stop layer 136, the dielectric bulk layer 138, via 142, the intermetal dielectric layer 144, and the metal line 146 are formed in a manner similar to the above-described embodiments. In addition, the modification as described above with respect to FIGS. 2A-2C, 3A-C and 4A-4C can be made to the NSFET embodiment shown in FIG. 5.

As described above, the method for forming an interconnect structure includes etching the metal lines $132_1$, $132_2$ and $133_3$ in such a way that the intermetal dielectric layer 130 protrudes from between the metal lines $132_1$, $132_2$ and $133_3$. As a result, the first portion 142A of the via 142 exceeding the edge of the metal line $132_2$ is located at a higher level than the second portion 142B of the via 142 overlapping the metal line $132_2$, which may prevent the minimum distance between the via 142 and the neighboring metal line $132_1$ from getting shorter. Therefore, the via-to-line overlay window and/or the via CD window of the photolithography process may be improved, which may relax the strict control/specification limits of the photolithography process. In addition, the leakage between the via and line may be less of concern and TDDB window may be improved. Therefore, the reliability and the yield of the resulting semiconductor device may be improved.

Embodiments of a method for forming an interconnect structure are provided. The method for forming the interconnect structure may include forming a first conductive feature through a first dielectric layer, etching the first conductive feature to form a recess over the first conductive feature, forming a second dielectric layer over the first dielectric layer and filling the recess, and forming a second conductive feature through the second dielectric layer and to the first conductive feature. As a result, a portion of the second conductive feature exceeding the edge of the first conductive feature may be raised. Therefore, the via-to-line overlay and/or the via CD window of the photolithography process may be improved.

In some embodiments, an interconnect structure is provided. The interconnect structure includes a transistor on a substrate, a first dielectric layer over the transistor, a first metal line through the first dielectric layer, a second dielectric layer over the first dielectric layer, and a via through the second dielectric layer and on the first metal line. A first side surface of the first dielectric layer includes a first portion in direct contact with the first metal line and a second portion in direct contact with the via, and the first portion of the first side surface of the first dielectric layer is aligned with the second portion of the first side surface of the first dielectric layer.

In some embodiments, an interconnect structure is provided. The interconnect structure includes a first intermetal dielectric layer over a substrate, a metal line surrounded by the first intermetal dielectric layer, a second intermetal dielectric layer over the first intermetal dielectric layer, a via in the second intermetal dielectric layer and on the first metal line, and a contact etching stop layer between the first intermetal dielectric layer and the second intermetal dielectric layer. A first side surface of the first intermetal dielectric layer includes a first portion in direct contact with the metal line and a second portion in direct contact with the contact etching stop layer, and the first portion of the first side surface of the first intermetal dielectric layer is aligned with the second portion of the first side surface of the first intermetal dielectric layer.

In some embodiments, a method for forming an interconnect structure is provided. The method for forming the interconnect structure includes forming a first dielectric layer over a transistor, forming a metal line in the first dielectric layer, and recessing the metal line to expose an upper portion of a side surface of the first dielectric layer. A lower portion of the side surface of the first dielectric layer is in direct contact with the metal line and aligned with the upper portion of the side surface of the first dielectric layer. The method also includes forming a second dielectric layer over the first dielectric layer and first dielectric layer, and forming a first via in the second dielectric layer and on the metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:

a transistor on a substrate;

a first dielectric layer over the transistor;

a first metal line through the first dielectric layer;

a second dielectric layer over the first dielectric layer;

a via through the second dielectric layer and on the first metal line, wherein a first side surface of the first dielectric layer includes a first portion in direct contact with the first metal line and a second portion in direct contact with the via, and the first portion of the first side surface of the first dielectric layer is aligned with the second portion of the first side surface of the first dielectric layer; and a second metal line on the via, wherein the first metal line extends in a first horizontal direction, and the second metal line extends in a second horizontal direction that is perpendicular to the first horizontal direction.

2. The interconnect structure as claimed in claim 1, wherein the via lands on a top surface of the first dielectric layer.

3. The interconnect structure as claimed in claim 1, further comprising:

a contact etching stop layer between the first dielectric layer and the second dielectric layer, wherein a second side surface of the first dielectric layer is opposite to the first side surface of the first dielectric layer and includes a first portion in direct contact with the first metal line and a second portion in direct contact with the contact etching stop layer.

4. The interconnect structure as claimed in claim 3, wherein the first portion of the second side surface of the first dielectric layer is aligned with the second portion of the second side surface of the first dielectric layer.

5. The interconnect structure as claimed in claim 1, wherein the first metal line is electrically connected to a source/drain region of the transistor.

6. The interconnect structure as claimed in claim 1, further comprising:

a contact etching stop layer on a top surface of the first metal line and between the first metal line and the second dielectric layer.

7. An interconnect structure, comprising:

a first intermetal dielectric layer over a substrate;

a metal line surrounded by the first intermetal dielectric layer;

a second intermetal dielectric layer over the first intermetal dielectric layer;

a via in the second intermetal dielectric layer and on the first metal line; and a contact etching stop layer between the first intermetal dielectric layer and the second intermetal dielectric layer, wherein a first side surface of the first intermetal dielectric layer includes a first portion in direct contact with the metal line and a second portion in direct contact with the contact etching stop layer, and the first portion of the first side surface of the first intermetal dielectric layer is aligned with the second portion of the first side surface of the first intermetal dielectric layer.

8. The interconnect structure as claimed in claim 7, wherein a top surface of the first intermetal dielectric layer is higher than a top surface of the metal line.

9. The interconnect structure as claimed in claim 7, wherein a second side surface of the first intermetal dielectric layer is opposite to the first side surface of the first intermetal dielectric layer and includes a first portion in direct contact with the metal line and a second portion in direct contact with the contact etching stop layer, and the first portion of the second side surface of the first intermetal dielectric layer is aligned with the second portion of the second side surface of the first intermetal dielectric layer.

10. The interconnect structure as claimed in claim 7, wherein the via is in direct contact with a top surface of the first intermetal dielectric layer.

11. The interconnect structure as claimed in claim 7, wherein a portion of the second intermetal dielectric layer extends between the contact etching stop layer and the via.

12. The interconnect structure as claimed in claim 7, wherein a lower portion of the via is surrounded by and in direct contact with the contact etching stop layer.

13. The interconnect structure as claimed in claim 7, further comprising:

a GAA FET on the substrate, wherein the metal line is electrically connected to the GAA FET.

14. A method for forming an interconnect structure, comprising:

forming a first dielectric layer over a transistor;

forming a metal line in the first dielectric layer;

recessing the metal line to expose an upper portion of a side surface of the first dielectric layer, wherein a lower portion of the side surface of the first dielectric layer is in direct contact with the metal line and aligned with the upper portion of the side surface of the first dielectric layer;

forming a contact etching stop layer along a top surface of the first dielectric layer, the upper portion of the side surface of the first dielectric layer and a top surface of the metal line;

forming a second dielectric layer over the metal line and the first dielectric layer, wherein the second dielectric layer is formed over the contact etching stop layer; and forming a first via in the second dielectric layer and on the metal line.

15. The method for forming the interconnect structure as claimed in claim 14, further comprising:

etching the second dielectric layer and the contact etching stop layer to form an opening, wherein the opening exposes the upper portion of the sidewall of the first dielectric layer; and forming a conductive material in the opening to form the first via.

16. The method for forming the interconnect structure as claimed in claim 15, wherein the opening further exposes the top surface of the first dielectric layer.

17. The method for forming the interconnect structure as claimed in claim 15, wherein the opening further exposes a portion of the contact etching stop layer along the upper portion of the side surface of the first dielectric layer.

18. The method for forming the interconnect structure as claimed in claim 14, further comprising:

forming a contact plug on a source/drain region of the transistor; and forming a second via on the contact plug, wherein the metal line is formed on the second via.

19. The method for forming the interconnect structure as claimed in claim 14, wherein forming the transistor comprises:

forming a plurality of nanostructures; and forming a gate stack to surround the plurality of nanostructures.

20. The method for forming the interconnect structure as claimed in claim 14, further comprising:

forming an isolation structure to surround a channel region of the transistor; and forming an interlayer dielectric layer over a source/drain region of the transistor.

* * * * *